(12) United States Patent
Mallikarjunaswamy

(10) Patent No.: US 11,456,596 B2
(45) Date of Patent: *Sep. 27, 2022

(54) USB TYPE-C LOAD SWITCH ESD PROTECTION

(71) Applicant: Alpha and Omega Semiconductor Incorporated, Sunnyvale, CA (US)

(72) Inventor: Shekar Mallikarjunaswamy, San Jose, CA (US)

(73) Assignee: ALPHA AND OMEGA SEMICONDUCTOR INCORPORATED, Sunnyvale, CA (US)

(*) Notice: Subject to any disclaimer, the term of this patent is extended or adjusted under 35 U.S.C. 154(b) by 7 days.

This patent is subject to a terminal disclaimer.

(21) Appl. No.: 17/205,866

(22) Filed: Mar. 18, 2021

(65) Prior Publication Data

US 2021/0210954 A1 Jul. 8, 2021

Related U.S. Application Data

(63) Continuation of application No. 15/244,996, filed on Aug. 23, 2016, now Pat. No. 10,978,869.

(51) Int. Cl.
*H02H 9/04* (2006.01)
*H01L 23/60* (2006.01)
(Continued)

(52) U.S. Cl.
CPC ....... *H02H 9/046* (2013.01); *H01L 23/49562* (2013.01); *H01L 23/49575* (2013.01);
(Continued)

(58) Field of Classification Search
CPC ... H02H 9/046; H01L 23/49575; H01L 23/60; H01L 23/49562; H01L 27/0277; H01L 27/0248; H01L 25/18; H01L 29/4916; H01L 29/78; H01L 29/4236; H01L 29/1095; H01L 29/1008; H01L 29/0688; H01L 29/0808; H01L 29/735;
(Continued)

(56) References Cited

U.S. PATENT DOCUMENTS 5,545,909 A * 8/1996 Williams ............... H02H 9/042
361/111
5,629,542 A * 5/1997 Sakamoto .......... H03K 17/0822
257/342

(Continued)

OTHER PUBLICATIONS

Andras Tantos, "H-Bridges—The basics", downloaded from the internet on Jul. 23, 2019, http://www.modularcircuits.com/blog/articles/h-bridge-secrets/h-bridges-the-basics/, Copyright 2011.
(Continued)

*Primary Examiner* — Kevin J Comber
(74) *Attorney, Agent, or Firm* — JDI Patent; Joshua Isenberg; Robert Pullman

(57) ABSTRACT

A MOSFET and an electrostatic discharge (ESD) protection device on a common chip includes a MOSFET with a source, a gate, and a drain, and an ESD protection device configured to implement a diode function that is biased to prevent current from flowing through the common chip from the source to the drain.

13 Claims, 23 Drawing Sheets

(51) Int. Cl.
| | |
|---|---|
| *H01L 23/495* | (2006.01) |
| *H01L 27/02* | (2006.01) |
| *H01L 25/18* | (2006.01) |
| *H01L 29/06* | (2006.01) |
| *H01L 29/08* | (2006.01) |
| *H01L 29/10* | (2006.01) |
| *H01L 29/423* | (2006.01) |
| *H01L 29/49* | (2006.01) |
| *H01L 29/735* | (2006.01) |
| *H01L 29/78* | (2006.01) |
| *H01L 29/861* | (2006.01) |

(52) U.S. Cl.
CPC .............. *H01L 23/60* (2013.01); *H01L 25/18* (2013.01); *H01L 27/0248* (2013.01); *H01L 27/0277* (2013.01); *H01L 29/0688* (2013.01); *H01L 29/0808* (2013.01); *H01L 29/0821* (2013.01); *H01L 29/0847* (2013.01); *H01L 29/1008* (2013.01); *H01L 29/1095* (2013.01); *H01L 29/4236* (2013.01); *H01L 29/4916* (2013.01); *H01L 29/735* (2013.01); *H01L 29/78* (2013.01); *H01L 29/861* (2013.01); *H01L 2224/04042* (2013.01); *H01L 2224/16245* (2013.01); *H01L 2224/32145* (2013.01); *H01L 2224/48247* (2013.01); *H01L 2224/73253* (2013.01); *H01L 2224/73265* (2013.01)

(58) Field of Classification Search
CPC ............... H01L 29/0821; H01L 29/861; H01L 29/0847; H01L 2224/32145; H01L 2224/73253; H01L 2224/16245; H01L 2224/73265; H01L 2224/48247; H01L 2224/04042; H01L 2924/00012
USPC .......................................................... 361/56
See application file for complete search history.

(56) References Cited

U.S. PATENT DOCUMENTS

| | | | |
|---|---|---|---|
| 7,851,314 | B2 | 12/2010 | Mallikarjunaswamy et al. |
| 7,919,817 | B2 | 4/2011 | Mallikarjunaswamy |
| 8,098,466 | B2 | 1/2012 | Mallikarjunaswamy |
| 8,174,070 | B2 | 5/2012 | Mallikarjunaswamy |
| 8,212,329 | B2 | 7/2012 | Mallikarjunaswamy et al. |
| 8,218,276 | B2 | 7/2012 | Mallikarjunaswamy |
| 8,378,420 | B2 | 2/2013 | Mallikarjunaswamy |
| 8,503,141 | B2 | 8/2013 | Mallikarjunaswamy |
| 8,542,470 | B2 | 9/2013 | Mallikarjunaswamy |
| 8,643,137 | B2 | 2/2014 | Mallikarjunaswamy et al. |
| 8,704,303 | B2 | 4/2014 | Mallikarjunaswamy |
| 8,791,723 | B2 | 7/2014 | Mallikarjunaswamy |
| 8,816,476 | B2 | 8/2014 | Mallikarjunaswamy |
| 8,889,487 | B2 | 11/2014 | Mallikarjunaswamy |
| 8,916,951 | B2 | 12/2014 | Mallikarjunaswamy |
| 8,937,356 | B2 | 1/2015 | Mallikarjunaswamy |
| 9,118,322 | B2 | 8/2015 | Husain et al. |
| 9,130,562 | B2 | 9/2015 | Mallikarjunaswamy |
| 9,159,828 | B2 | 10/2015 | Mallikarjunaswamy et al. |
| 9,190,408 | B2 | 11/2015 | Mallikarjunaswamy |
| 9,214,534 | B2 | 12/2015 | Mallikarjunaswamy et al. |
| 9,312,335 | B2 | 4/2016 | Mallikarjunaswamy |
| 9,337,284 | B2 | 5/2016 | Mallikarjunaswamy |
| 9,355,971 | B1 | 5/2016 | Mallikarjunaswamy |
| 9,373,682 | B2 | 6/2016 | Mallikarjunaswamy |
| 9,437,673 | B2 | 9/2016 | Mallikarjunaswamy |
| 9,460,926 | B2 | 10/2016 | Mallikarjunaswamy |
| 9,466,972 | B2 | 10/2016 | Mallikarjunaswamy |
| 9,748,346 | B2 * | 8/2017 | Mallikarjunaswamy ..................... H01L 29/8611 |
| 2001/0052814 | A1 | 12/2001 | Takita |
| 2004/0137690 | A1 * | 7/2004 | Mallikarjunaswamy ..................... H01L 29/7393 438/322 |
| 2007/0108915 | A1 * | 5/2007 | Ribarich .............. H05B 41/298 315/247 |
| 2009/0027302 | A1 | 1/2009 | Li |
| 2009/0115018 | A1 | 5/2009 | Mallikarjunaswamy |
| 2009/0201072 | A1 * | 8/2009 | Honea .............. H03K 17/08142 327/424 |
| 2009/0268361 | A1 | 10/2009 | Mallikarjunaswamy |
| 2009/0283831 | A1 | 11/2009 | Mallikarjunaswamy |
| 2011/0049623 | A1 | 3/2011 | Mallikarjunaswamy et al. |
| 2011/0127602 | A1 | 6/2011 | Mallikarjunaswamy |
| 2011/0180845 | A1 | 7/2011 | Mallikarjunaswamy |
| 2011/0267724 | A1 | 11/2011 | Mallikarjunaswamy |
| 2012/0086499 | A1 | 4/2012 | Husain et al. |
| 2012/0187481 | A1 | 7/2012 | Mallikarjunaswamy |
| 2012/0235232 | A1 | 9/2012 | Mallikarjunaswamy et al. |
| 2012/0243712 | A1 | 9/2012 | Yamada |
| 2012/0273878 | A1 | 11/2012 | Mallikarjunaswamy |
| 2012/0273879 | A1 | 11/2012 | Mallikarjunaswamy et al. |
| 2012/0281329 | A1 | 11/2012 | Mallikarjunaswamy |
| 2013/0016446 | A1 | 1/2013 | Mallikarjunaswamy |
| 2013/0075741 | A1 | 3/2013 | Mallikarjunaswamy |
| 2013/0075746 | A1 | 3/2013 | Mallikarjunaswamy |
| 2013/0119465 | A1 | 5/2013 | Mallikarjunaswamy |
| 2014/0049293 | A1 | 2/2014 | Mallikarjunaswamy |
| 2014/0167218 | A1 | 6/2014 | Mallikarjunaswamy et al. |
| 2014/0225190 | A1 | 8/2014 | Mallikarjunaswamy |
| 2014/0268441 | A1 | 9/2014 | Mallikarjunaswamy |
| 2014/0308784 | A1 | 10/2014 | Mallikarjunaswamy |
| 2015/0069464 | A1 | 3/2015 | Mallikarjunaswamy et al. |
| 2015/0221720 | A1 | 8/2015 | Mallikarjunaswamy |
| 2015/0287820 | A1 | 10/2015 | Mallikarjunaswamy |
| 2015/0340856 | A1 | 11/2015 | Mallikarjunaswamy |
| 2015/0380398 | A1 | 12/2015 | Mallikarjunaswamy |
| 2015/0380413 | A1 | 12/2015 | Mallikarjunaswamy |
| 2015/0380483 | A1 | 12/2015 | Mallikarjunaswamy |
| 2016/0099242 | A1 | 4/2016 | Mallikarjunaswamy |
| 2016/0225898 | A1 | 8/2016 | Mallikarjunaswamy |
| 2016/0247895 | A1 | 8/2016 | Mallikarjunaswamy et al. |
| 2016/0358917 | A1 | 12/2016 | Mallikarjunaswamy |

OTHER PUBLICATIONS

Non-Final Office Action for U.S. Appl. No. 15/244,996, dated Dec. 10, 2018.
Non-Final Office Action for U.S. Appl. No. 15/244,996, dated May 9, 2019.
Notice of Allowance dated Dec. 2, 2021 for U.S. Appl. 165/244,996.

* cited by examiner

USB TYPE-C LOAD SWITCH ESD PROTECTION

CLAIM OF PRIORITY

This application is a continuation of U.S. patent application Ser. No. 15/244,996 filed Aug. 23, 2016, the entire contents of which are incorporated herein by reference.

FIELD OF THE DISCLOSURE

This disclosure relates to integrated circuits and more specifically to electrostatic discharge protection in USB type-C load switches.

BACKGROUND OF INVENTION

The Universal Serial Bus (USB) system is a hot insertion and removal system, and accordingly USB components are subject to Electrostatic Discharge (ESD). State-of-the-art USB integrated circuits (ICs) are manufactured on high integration CMOS processes making them extremely sensitive to damage from the high static voltages associated with an ESD event. However, ESD protection is not yet a specific requirement of the USB specification.

Some USB hub chips are internally protected from ESD events ranging from 500V to 2 kV. This may provide a false sense of security since IEC 61000-4-2 typically requires commercial equipment pass ESD immunity tests with voltages up to 15 kV for air discharge and 8 kV for contact discharge. Ten pulses in each polarity are required for each test level. The IEC specification allows all cables to be attached to the equipment during testing. As such, the equipment may pass certain regulatory tests with the shielded USB cable attached. IEC61000 ESD protection for USB type-C load switches can be provided with additional build of materials on the board level using a transient voltage suppressor (TVS) diode that increases total system cost.

However, USB is a hot plugging bus by definition. When the socket is open, it is vulnerable to a potentially hazardous strike. The user may initiate the strike while plugging and unplugging a peripheral device, or by just reaching for a nearby switch. Physical contact with the port is not necessary. An air discharge event can occur several centimeters away from the conducting surface. Damage to the USB interface IC can occur as a result of the high static potential or from the conducted ESD currents. The resulting damage can be catastrophic or latent. Latent failures manifest themselves long after the ESD event has occurred. Therefore, while USB ESD protection is not yet a specific requirement of the USB specification, ESD protection is certainly needed.

Currently, IEC61000 ESD protection for USB type-C load switches can be provided with additional build of materials on the board level using a transient voltage suppressor (TVS) diode. However, providing such protection at board level increases the total system cost. Additionally, meeting the required 30 V ESD protection for an IEC rating of IEC6100-4-5 requires larger silicon area on the ICs which would significantly increase both the IC chip size and the cost. Therefore, there is a need to provide integrated, low-cost ESD protection for USB components.

It is within this context that embodiments of the present invention arise.

BRIEF DESCRIPTION OF THE DRAWINGS

Objects and advantages of load switch ESD protection in accordance with aspects of the present disclosure will become apparent upon reading the following detailed description and upon reference to the accompanying drawings in which.

DESCRIPTION OF THE SPECIFIC EMBODIMENTS

Introduction

Transient voltage suppressors (TVS) are devices used to protect integrated circuits from damages caused by over voltage imposed onto the integrated circuit. An integrated circuit is designed to operate over a normal range of voltages. However, in situations such as electrostatic discharge (ESD), electrical fast transients and lightning, an unexpected and uncontrollable high voltage may accidentally strike onto the circuit. The TVS devices are required to provide protection to circumvent the damages that are likely to occur to the integrated circuits when such over voltage conditions occur. As an increasing number of devices are implemented with integrated circuits that are vulnerable to over voltage damages, demands for TVS protection are also increased. Exemplary applications of TVS can be found in USB power and data line protection, digital video interfaces, high speed Ethernet, Notebook computers, monitors and flat panel displays.

Figure 1:
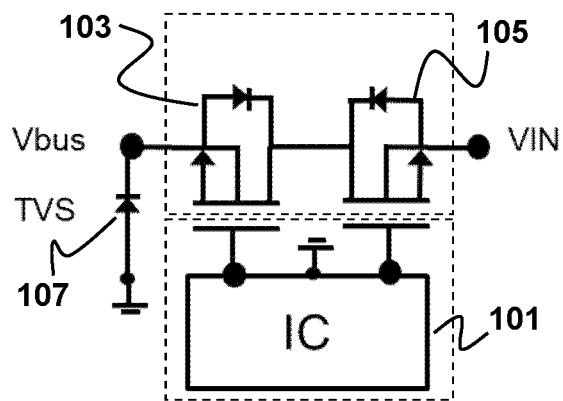
FIG. 1 is a circuit diagram illustrating a conventional USB type-C load switch device with additional on-board electrostatic discharge (ESD) protection in accordance with the prior art.

FIG. 1 shows a circuit diagram illustrating a conventional USB type-C load switch device 100 with additional on-board ESD protection in accordance with the prior art. Such conventional systems generally comprise one of two configurations. In the first configuration, the USB type-C load switch comprises four discrete components, including an IC 101, 2 MOSFETS 103 and 105, and a TVS 107 that provides ESD protection. In this configuration, the TVS device is provided with additional build of materials on the board level, which increases the total system cost. In the alternative configuration (not shown), the USB type-C load switch comprises a monolithic IC, MOSFETs, and TVS on one chip. However, in order to provide the desired level of surge protection (e.g., the 30 V protection of IEC6100-4-5), the chip would need to be extremely large, and would be correspondingly expensive.

Figure 2:
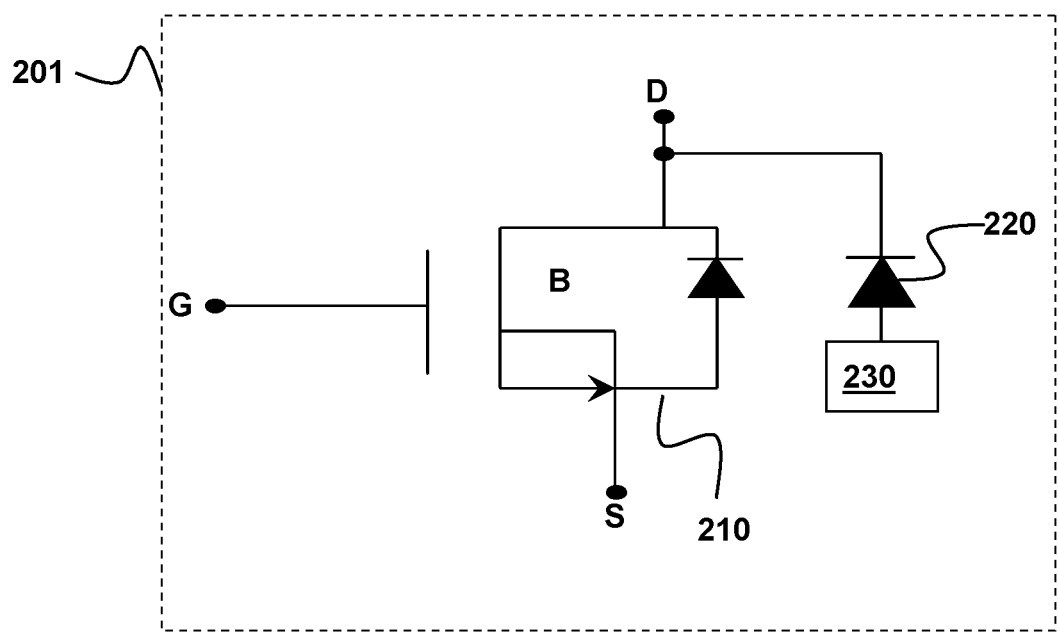
FIG. 2 is a circuit diagram of a device with a MOSFET and ESD protection integrated on a single chip in accordance with an embodiment of the present invention.

Thus, for a device with IEC-rated ESD protection, there is a need provide both a competitive chip size as well as a low-cost manufacturing solution. FIG. 2 depicts an example device that addresses both these needs in accordance with an aspect of the present disclosure. FIG. 2 shows a circuit diagram of a four terminal device 200 with a MOSFET 210 and ESD protection device 220 integrated on a single chip 201. The ESD protection device 220 comprises a TVS functioning as a diode with its cathode connected to the drain of the MOSFET and its anode connected to a separate pad 230 for connection of the device to ground. The pad 230 provides the fourth terminal of the device in addition to the source, the gate and the drain terminals of the MOSFET.

Figure 3:
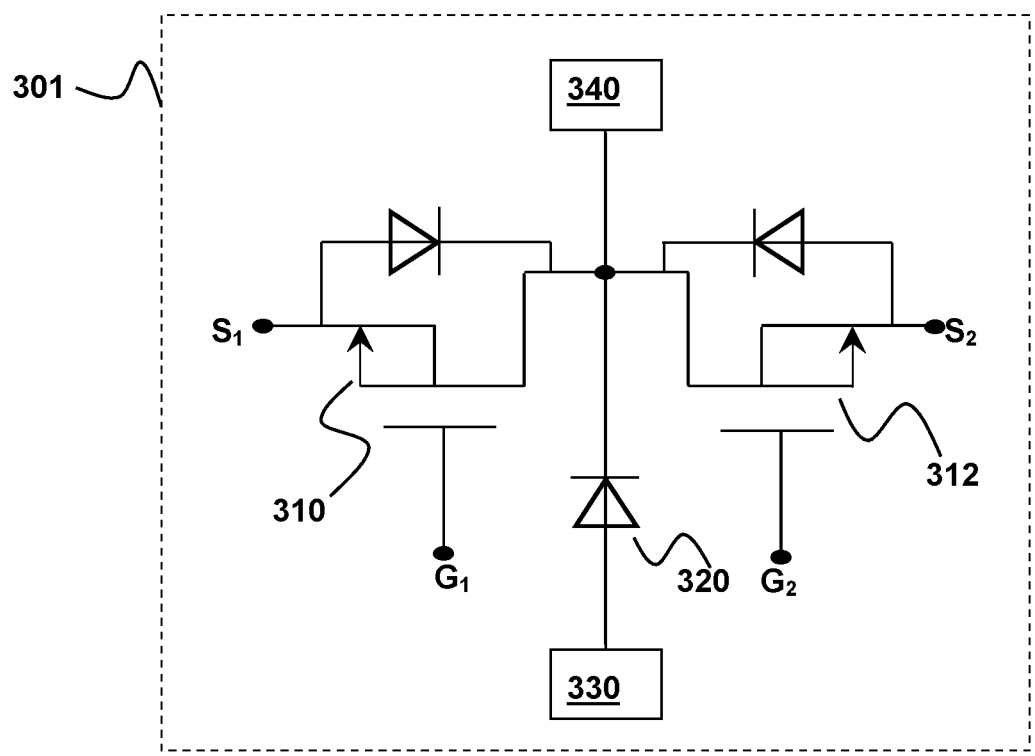
FIG. 3 is a circuit diagram of a load switch device with integrated ESD protection in accordance with an alternative embodiment of the present invention.

FIG. 3 provides a circuit diagram of a common drain MOSFET device 300 with integrated ESD protection in accordance with an alternative aspect of the present disclosure. The example device of FIG. 3 includes back-to-back MOSFETs 310 and 312 and an ESD protection device 320 which are all integrated in a common semiconductor chip 301. The ESD protection device 320 comprises a TVS functioning as a diode with its cathode connected to the common drain of the MOSFETs 310 and 312 and its anode connected to a separate pad 330 for connection of the device to ground. As an option, ab additional pad 340 connected to the common drain of the MOSFETs 310 and 312 may be provided for external connection, in addition to the respective source and gate terminals of the MOSFETs 310 and 312.

Figure 4A:
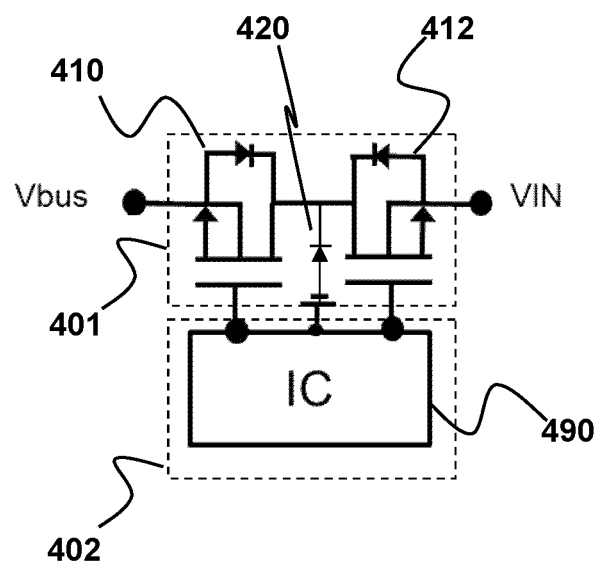
FIG. 4A is a circuit diagram of a two-chip load switch device with integrated ESD protection in accordance with an alternative embodiment of the present invention.

FIG. 4A is a circuit diagram of a two-chip load switch device 400 with integrated ESD protection in accordance with an alternative aspect of the present disclosure. The example device of FIG. 4A comprises a first chip 401 and a second chip 402. The first chip 401 includes back-to-back MOSFETs 410 and 412 and an ESD protection device 420. The ESD protection device 420 comprises a TVS with a diode function. The ESD protection device 420 shares a common drain with the MOSFETs 410 and 412. The second chip 402 includes a controller IC 490 that switches the MOSFETs 410, 412 by selectively applying controlling voltages to their respective gates. The MOSFETs 410 and 412 have gates controlled by the IC 490. The first chip 401 and the second chip 402 may be co-packaged as a single packaged device 400. The example device 400 is designed to short to ground at a designated voltage between 7 V to 30 V, and accordingly is able to achieve an IEC protection rating of IEC6100-4-5.

Figure 4B:
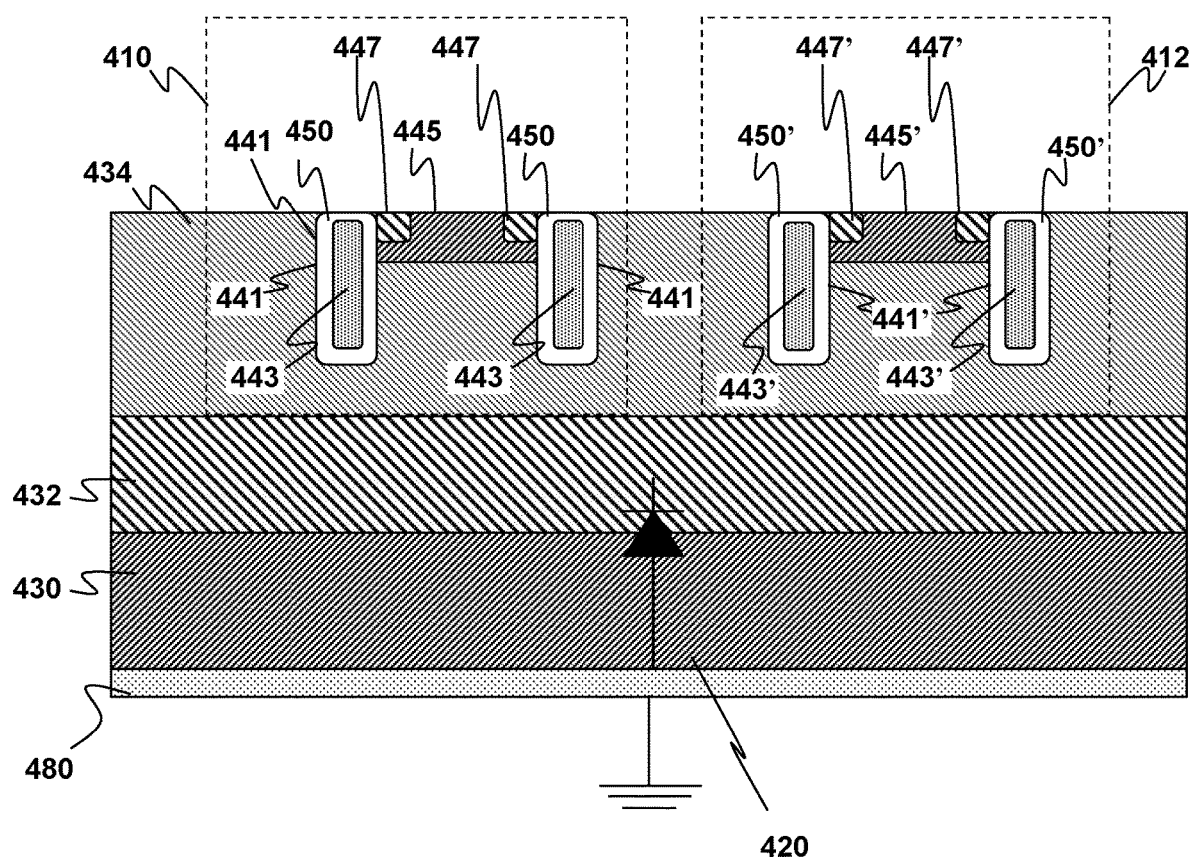
FIG. 4B is a cross-sectional view of the first chip of the load switch device in FIG. 4A.

FIG. 4B is a cross-sectional view of the first chip 401 of the example two-chip load switch device in FIG. 4A. By way of example chip 401 may include a P doped semiconductor layer 430 on which are formed a heavily N+ doped semiconductor layer 432 and a lightly N– doped epitaxial layer 434. By way of example, and not by way of limitation, a layer of lightly doped N-type epitaxial silicon may be grown over a P substrate after a N+ doped buried layer is implanted into a top portion of a P substrate. Examples of N-type dopant ions include Phosphorus and Arsenic. At least two P body regions 445 and 445' are formed within a top layer of the epitaxial layer 434, e.g., by masked implantation of suitable P-type dopant ions, such as Boron. Gate trenches 441, 441' are formed within the epitaxial layer 434 proximate the P body regions 445, 445'. Gate electrodes 443, 443' are formed in the gate trenches and electrically isolated from the epitaxial layer 434 and body regions 445, 445' by gate insulator layers 450, 450' (e.g., layers of thermal oxide) that line the sidewalls and bottoms of the gate trenches 441, 441'. First and second N+ source regions 447 and 447' are formed within body regions 445, 445', proximate the gate trenches 441, 441', as illustrated. Body region 445, gate electrode 443, gate insulator layer 450, and source regions 447 respectively form the first MOSFET 410. Body region 445', gate electrode 443', gate insulator layer 450', and source regions 447' respectively form the second MOSFET 412. The N+ doped layer 432 acts as a common drain for both MOSFETs 410, 412. The first and second MOSFETs 410, 412 may be configured in a back-to-back arrangement through suitably patterned insulation layers, metal layers and contact structures formed on the epitaxial layer 434, but not shown in FIG. 4B for the sake of clarity. Such a configuration allows the body 445 and source 447 of the first MOSFET 410 to be shorted and connected to a first source terminal on top surface of the chip for connection to $V_{bus}$ while the body 445' and source 447' of the second MOSFET 412 are shorted and connected to a second source terminal on top surface of the chip for connection to $V_{IN}$. Separate electrical connections to the gates 443, 443' of the first and second MOSFETs may be made via gate runners and vertical contacts, as is conventionally done to provide first and second gate terminals on top surface of the chip. Optional contact pads electrically connected to the common drain may be provided on top surface of the chip through diffusion sinker or buried metal connection to the N+ layer 432.

The ESD protection device 420 provides ESD protection via a TVS diode comprising a vertical PN junction formed between the N+ doped layer 432 and the P doped layer 430. The chip 401 may make external electrical contact via a metal layer 480 on a back side of the substrate with additional P+ dopants implanted from the backside of the substrate to enhance ohmic contact to the metal layer 480. Metal layer 480 may be comprised of various metals, including by way of example and not by way of limitation, Aluminum or Copper. Metal layer 480 provides a contact pad to the anode of the TVS diode.

Figure 4C:
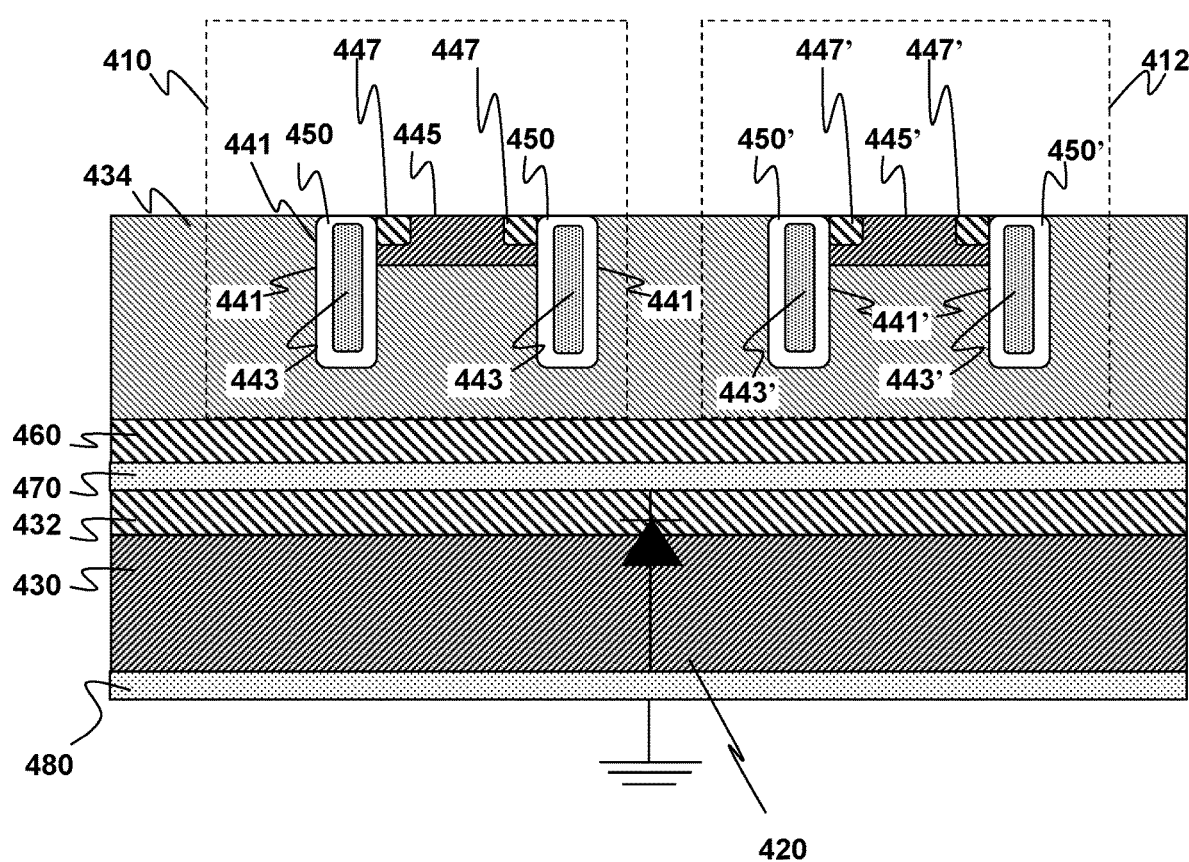
FIG. 4C is a cross-sectional view of an alternative embodiment of the first chip in a "stacked chip" alternative embodiment of the load switch device in FIG. 4A.

FIG. 4C is a cross-sectional view of a "stacked chip" alternative embodiment of the load switch device in FIG. 4A. In this example a single chip 401A may be formed using two different substrates that are stacked together as a single chip. A heavily N+ doped layer 432 is formed on a P doped semiconductor substrate 430. A metal layer 470 is then formed on the N+ doped layer 432. A heavily doped N+ semiconductor substrate layer 460 which supports a lightly N− doped epitaxial layer 434 is attached to the metal layer 470, preferably with a metal layer deposited to a bottom of the heavily doped N+ semiconductor substrate layer 460. As in the implementation depicted in FIG. 4B, MOSFETs 410, 412 having gate trenches 441, 441' with gates 443, 443' and gate insulators 450, 450', body regions 445, 445', and source regions 447, 447' are formed within an upper portion of the epitaxial layer 434. The N+ substrate 460 acts as a common drain for both MOSFETs 410, 4112.

As with the embodiment shown in FIG. 4B, the first and second MOSFETs 410, 412 may be configured in a back-to-back arrangement through suitably patterned insulation layers, metal layers formed on a top surface of the chip and contact structures (not shown) that allow the body 445 and source 447 of the first MOSFET 410 to be shorted and connected to $V_{bus}$ while the body 445' and source 447' of the second MOSFET 412 are shorted and connected to $V_{IN}$. Separate electrical connections to the gates 443, 443' of the first and second MOSFETs may be made via gate runners and vertical contacts, as is conventionally done on top surface of the chip.

ESD protection is provided by a TVS diode 420 resulting from a vertical PN junction formed at the interface between the P substrate 430 and the N+ layer 432. Chip 401A makes external contact via a metal layer 480 on a back side of the substrate 430 with additional P+ dopants implanted from the backside of the substrate 430 to enhance ohmic contact to the metal layer 480. Metal layer 480 may be comprised of various metals, including by way of example and not by way of limitation, aluminum or copper. Refereeing back to FIG. 3, the pad 330 is provided by metal layer 480.

Figure 4D:
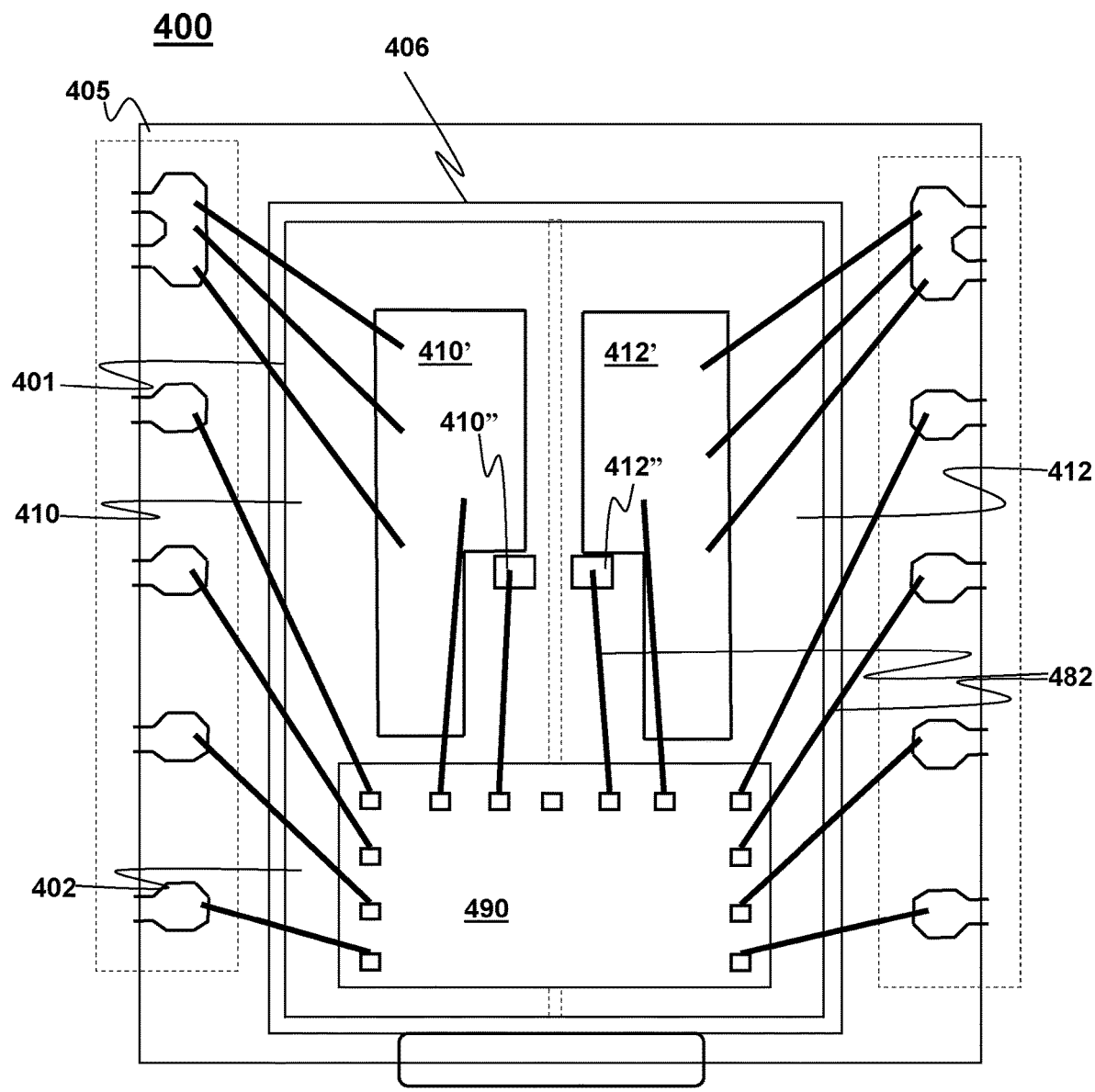
FIG. 4D is a top-down view of the example load switch device illustrated in FIG. 4A in a packaged state in accordance with an alternative embodiment of the present invention.

There are a number of ways in which integrated MOSFET and TVS devices may be packaged with integrated circuits for ESD protection. A non-limiting example is depicted in FIG. 4D, which illustrates a top-down view of the example load switch device 400 illustrated in FIG. 4A in a packaged state. The example device 400 comprises a first chip 401 mounted on a die pad 406 of a lead frame 405 with the bottom metal layer 480 electrically connected to the die paddle 406 functioning as the ground. A second chip 402 is mounted on top of a portion of the first chip 401. As shown in FIGS. 4A-4C, the first chip 401 includes the back-to-back MOSFETs 410 and 412 and the TVS diode 420. Source connections may be made, e.g., by wire bonds 482 from terminals on the IC 490 to source contact pads 410', 412' on the first chip and from the source contact pads 410', 412' to respective leads disposed around the die paddle 406. The source contact pads 410', 412' on a top surface of the first chip 401 may respectively be electrically connected to the source regions 445, 445' of the first and second MOSFETs 410, 412 via vertical electrical contacts, e.g., in the form of tungsten plugs, as is commonly done. Typically, the body regions 445, 445' are shorted to respective source regions 447, 447'. Similarly, gate connections may be made, e.g., by wire bonds from other terminals on the IC 590 to gate contact pads 410", 412" on the top surface of the first chip 501. The gate contact pads 410", 412" may respectively be electrically connected to the gate electrodes 543, 543' of the first and second MOSFETs 410, 412 via vertical electrical contacts, e.g., tungsten plugs and gate runners as is commonly done.

Figure 5A:
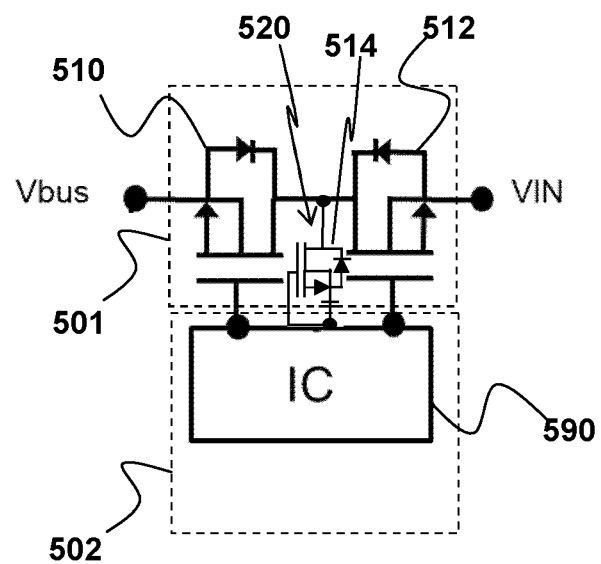
FIG. 5A is a circuit diagram of a two-chip load switch device with integrated ESD protection in accordance with an alternative embodiment of the present invention.

FIG. 5A is a circuit diagram of a two-chip load switch device 500 with integrated ESD protection in accordance with an alternative embodiment of the present invention. The example device of FIG. 5A comprises a first chip 501 and a second chip 502. The first chip 501 includes back-to-back MOSFETs 510 and 512 and an ESD protection device. In this implementation, the ESD protection device 520 comprises a third MOSFET structure that functions as a TVS diode through connection of its source and gate to ground. The third MOSFET 514 shares a common drain with MOSFETs 510 and 512. The second chip 502 includes an IC 590, for example, a gate driver IC. The MOSFETs 510, 512, and 520 have gates controlled by the IC 590 and the source and gate of the third MOSFET 514 may be grounded through a pin on the IC 590. By way of example and not by way of limitation, the device 500 may be designed to short to ground at a designated voltage between 7 V to 30 V, and accordingly to achieve an IEC protection rating of IEC6100-4-5.

Figure 5B:
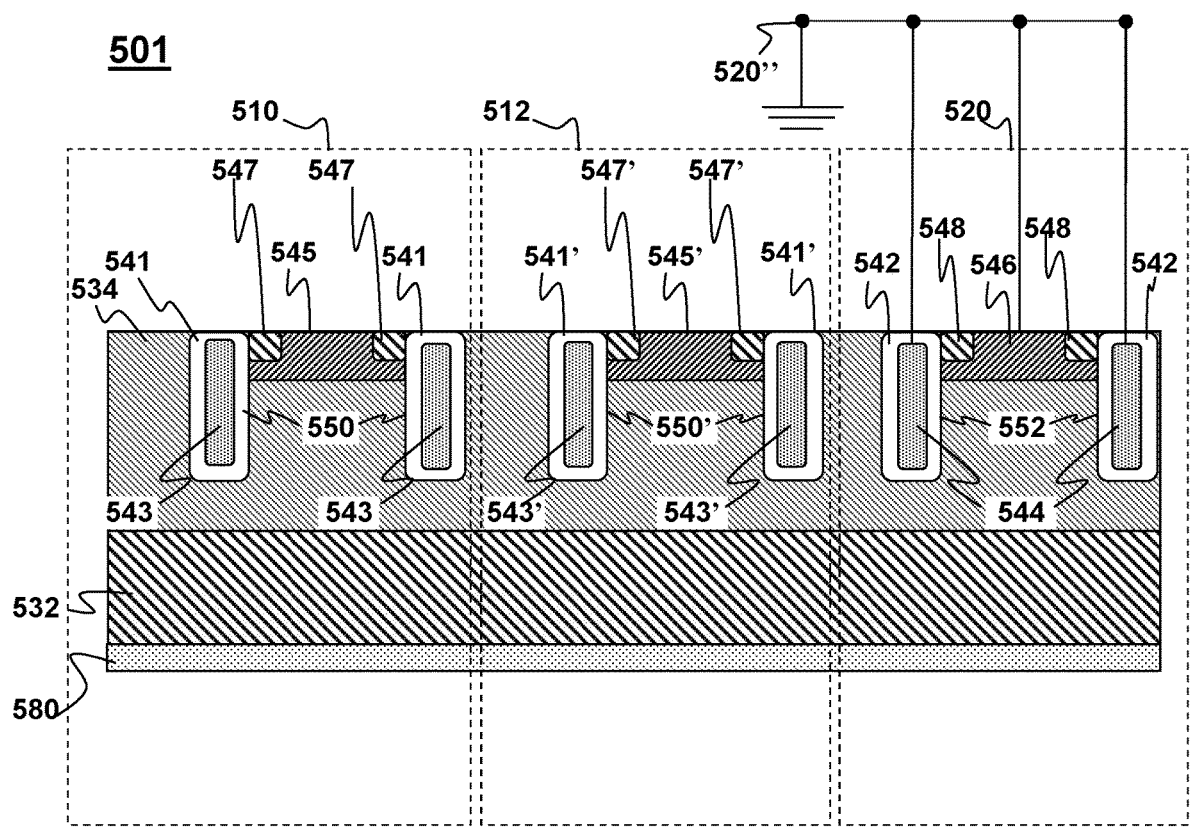
FIG. 5B is a cross-sectional view of the first chip of the load switch device in FIG. 5A.

FIG. 5B is a cross-sectional view of the first chip 501 of the example two-chip load switch device in FIG. 5A. Unlike chip 401 of FIG. 4B and chip 401A of FIG. 4C, the example chip 501 may be formed on a heavily N+ doped semiconductor substrate layer 532 and a lightly N− doped epitaxial layer 534. As in FIG. 5B, P body regions 545, 545' and 546 for first, second and third MOSFETs 510, 512, and 514 are formed within an upper portion of the epitaxial layer 534. First, second, and third MOSFETs 510, 512, and 514 respectively further include gate trenches 541, 541', 542, with gate electrodes 543, 543', and 544 and gate insulators 550, 550', and 552 formed within the epitaxial layer 534, N+ source regions 547, 547' and 548 formed within body regions 545, 545', and 546, as illustrated. The N+ doped substrate layer 532 acts as a common drain for all three MOSFETs 510, 512, 514.

As with the embodiments shown in FIG. 4B and FIG. 4C, the first and second MOSFETs 510, 512 may be configured in a back-to-back arrangement through suitably patterned insulation layers, metal layers and contact structures (not shown) that allow the body 545 and source 547 of the first MOSFET 510 to be shorted and connected to $V_{bus}$ while the body 545' and source 547' of the second MOSFET 512 are shorted and connected to $V_{IN}$. Separate electrical connections to the gates 543, 543' of the first and second MOSFETs may be made via gate runners and vertical contacts, as is conventionally done.

In the implementation shown in FIG. 5B, the ESD protection device 520 is provided by a third MOSFET 514. The gate 544, body 546, and source 548 of the third MOSFET 514 may all be electrically connected to ground and isolated from undesired short circuits by suitable patterning of the aforementioned patterned insulation layers, metal layers and contact structures. If such a connection is desired, the chip 501 may make external electrical contact via a metal layer 580 on a back side of the substrate layer 530 to provide a contact pad for the common drain. Metal layer 580 may be comprised of various metals, including by way of example and not by way of limitation, aluminum or copper.

In the implementations shown in FIG. 5A and FIG. 5B, ESD protection is provided by the body diode/parasitic NPN transistor of the third MOSFET 514, the gate 544, body 546, and source 548 of which are connected to ground via a top connection. In this implementations, the common drain for all three MOSFETS 510, 512, 514 formed by the N+ semiconductor substrate layer 532. Alternative implementations may include ESD protection provided by both the body diode/parasitic NPN transistor of the third MOSFET 514 and also a bottom diode 520' in parallel with the third MOSFET 514 between the common drain and ground in such implementations in the embodiments shown in FIGS. 5C and 5D.

Figure 5C:
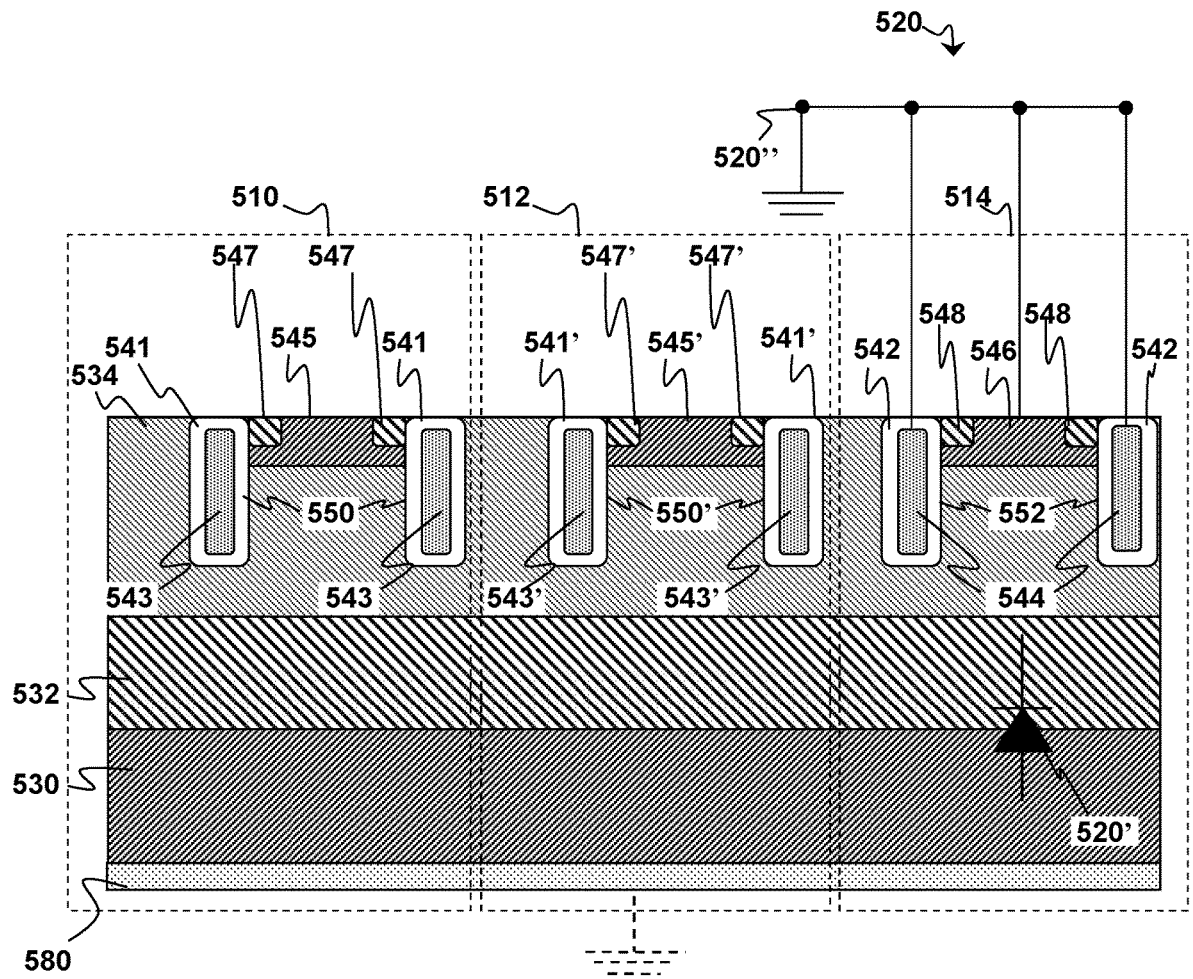
FIG. 5C is a cross-sectional view of an alternative implementation of the first chip of the load switch device in FIG. 5A including a bottom diode.

FIG. 5C is a cross-sectional view of an alternative embodiment of the first chip 501 including a bottom diode 520' in parallel with the third MOSFET 514 between the common drain and ground. Similar to chip 401 of FIG. 4B, the example chip 501A may be formed on a P doped semiconductor layer 530 on which are formed a heavily N+ doped layer 532 and a lightly N– doped epitaxial layer 534. As in the implementation depicted in FIG. 5A, P body regions 545, 545' and 546 for first, second and third MOSFETs 510, 512, and 514 are formed within an upper portion of the epitaxial layer 534. First, second, and third MOSFETs 510, 512, and 514 respectively further include gate trenches 541, 541', 542, with gate electrodes 543, 543', and 544 and gate insulators 550, 550', and 552 formed within the epitaxial layer 534, N+ source regions 547, 547' and 548 formed within body regions 545, 545', and 546, as illustrated. The N+ doped substrate layer 532 acts as a common drain for all three MOSFETs 510, 512, 514.

Figure 5D:
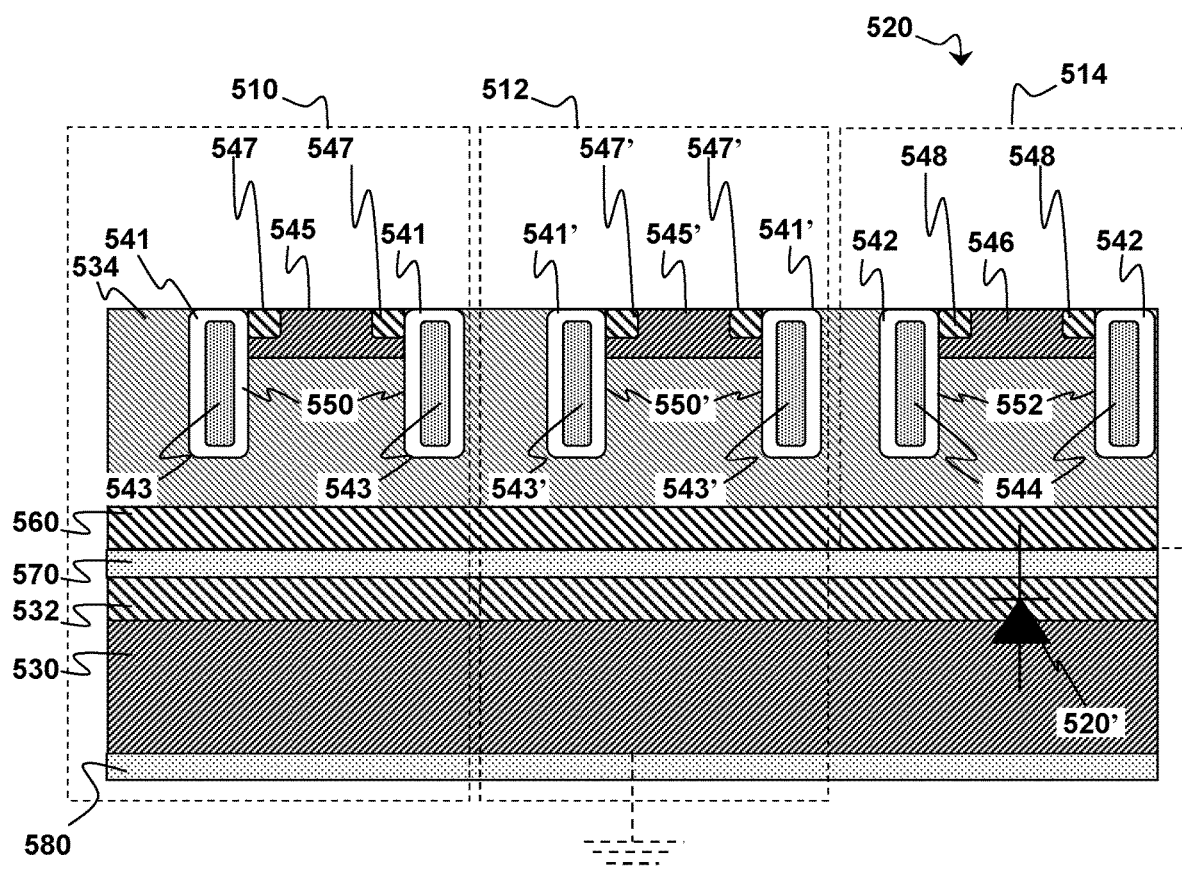
FIG. 5D is a cross-sectional view of another alternative implementation of the first chip in a "stacked chip" alternative embodiment of the load switch device in FIG. 5A.

FIG. 5D is a cross-sectional view of an alternative embodiment of the first chip 501 in a "stacked chip" alternative embodiment of the load switch device in FIG. 5A. Like the chip 401A of FIG. 4C, example chip 501A' may be formed using two different substrates that are stacked together as a single chip. A heavily N+ doped layer 532 is formed on a P doped semiconductor substrate 530. A metal layer 570 is then formed on the semiconductor substrate layer 532. A heavily doped N+ semiconductor substrate layer 560 is attached to the metal layer 570. A lightly N– doped epitaxial layer 534 is formed on the heavily N+ doped semiconductor substrate layer 560. As in the implementation depicted in FIG. 5A, MOSFETs 510, 512, and 514 having gate trenches 541, 541', and 542 with gates 543, 543' and 544, gate insulators 550, 550', and 552, body regions 545, 545', and 546, and source regions 547, 547', and 548 are formed within an upper portion of the epitaxial layer 534. The N+ semiconductor layer 560 acts as a common drain for all three MOSFETs 510, 512, 514.

As with the embodiment shown in FIG. 5A, in the embodiments shown in FIGS. 5C and 5D, the first and second MOSFETs 510, 512 may be configured in a back-to-back arrangement through suitably patterned insulation layers, metal layers and contact structures (not shown) that allow the body 545 and source 547 of the first MOSFET 510 to be shorted and connected to $V_{bus}$ while the body 545' and source 547' of the second MOSFET 512 are shorted and connected to $V_{IN}$. Separate electrical connections to the gates 543, 543' of the first and second MOSFETs may be made via gate runners and vertical contacts, as is conventionally done.

Figure 5E:
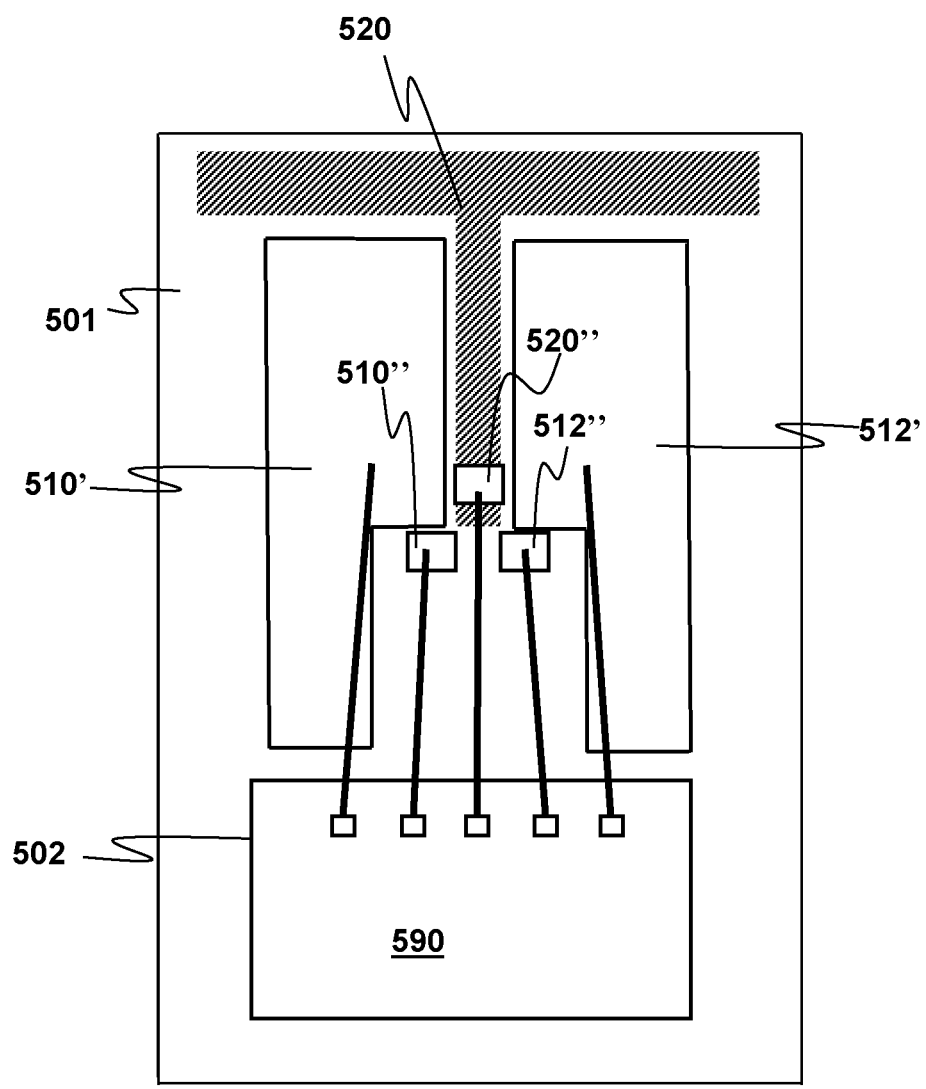
FIG. 5E illustrates a top-down view of the example load switch device illustrated in FIG. 5A in an unpackaged state in accordance with an embodiment of the present invention.

FIG. 5E illustrates a top-down view 500A of the example load switch device illustrated in FIG. 5A in an unpackaged state. The example device of FIG. 5E comprises a first chip 501 and a second chip 502 mounted on a portion of the first chip 501. The first chip 501 includes back-to-back MOSFETs 510 and 512 and an ESD protection device 520, as shown in FIG. 5B. The ESD protection device includes a third MOSFET which may be configured like MOSFET 514 in FIGS. 5A-5D structure that functions as a TVS diode through its connection to ground. The layout of the body region 546 and source regions 548 of the third MOSFET 514 is indicated by the T-shaped shaded region in FIG. 5D. Alternatively the third MOSFET 514 may be disposed around the edges of the first chip completely surrounding the MOSFETs 510 and 512. As described above, the third MOSFET 514 shares a common drain with MOSFETs 510 and 512 in the form of N+ layer 532. The second chip 502 includes an IC 590, for example, a USB load switch IC, such as a load switch driver IC. The first and second MOSFETs 510, 512, and (optionally) the third MOSFET 514 have their respective gates controlled by the IC 590. The gate 544 of the third MOSFET 514 along with the body 546 and source 548 are typically tied to ground, as shown in FIG. 5B, however, in some implementations, the gate 544 may be connected to an active pin on the second chip IC to apply a changing voltage to the gate. Such an implementation can be useful where it is desired to trigger the TVS earlier, i.e., at lower BV, by biasing the gate 544 during a fast change in the applied gate voltage (dv/dt control).

Source connections may be made, e.g., by wire bonds from terminals on the IC 590 to source contact pads 510', 512' on the first chip. The source contact pads 510', 512' on a top surface of the first chip 501 may respectively be electrically connected to the source regions 545, 545' of the first and second MOSFETs 510, 512 via vertical electrical contacts, e.g., in the form of tungsten plugs, as is commonly done. Typically, the body regions 545, 545' are shorted to respective source regions 547, 547'. Similarly, gate connections may be made, e.g., by wire bonds from other terminals on the IC 590 to gate contact pads 510", 512" on the top surface of the first chip 501. The gate contact pads 510", 512" may respectively be electrically connected to the gate electrodes 543, 543' of the first and second MOSFETs 510, 512 via vertical electrical contacts, e.g., tungsten plugs and gate runners as is commonly done.

Furthermore, a TVS contact pad 520" on the top surface of the first chip 501 may be electrically connected to the gate electrodes 544, body region 546 and source regions 548 of the third MOSFET 514 via vertical electrical contacts, such as tungsten plugs. TVS contact pad 520" may be electrically connected to a corresponding ground pin of the IC 590, in any suitable manner, such as wire bonding. In an alternative embodiment where the gate 544 is connected to an active pin on the second chip IC to trigger the TVS at a lower voltage, separate TVS contact pads (not shown) are provided to respectively connect the gate 544 to a control pin of IC 590 and the body 546 and source 548 to a corresponding ground pin of the IC 590. Device 500A may be attached to a die pad of a lead frame as shown in FIG. 4D, except the die pad would be connected to the common drain instead of ground. In case the first chip 501 is replaced with alternative first chip 501A or 501A', the die pad would be the ground.

Figure 6A:
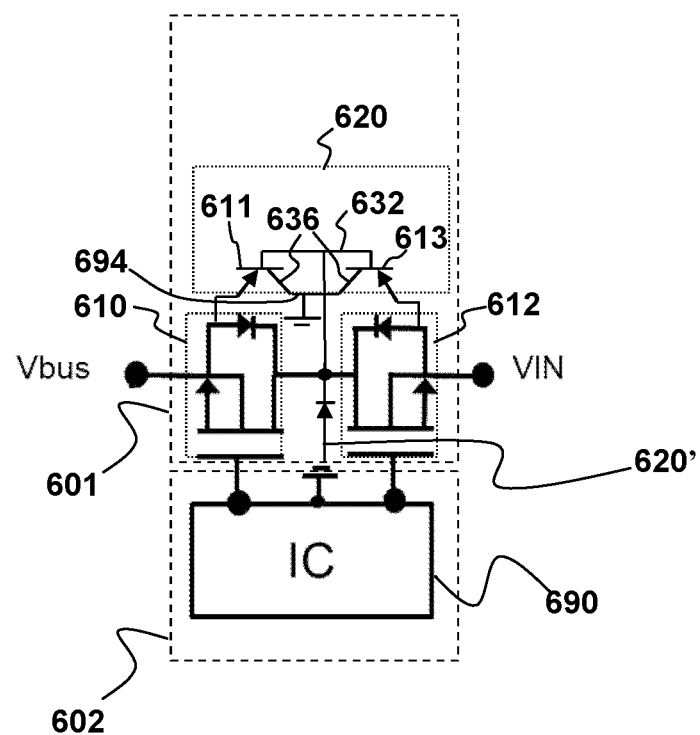
FIG. 6A is a circuit diagram of a two-chip load switch device with integrated ESD protection in accordance with an alternative embodiment of the present invention.

FIG. 6A is a circuit diagram of a two-chip load switch device 600 with integrated ESD protection in accordance with another alternative embodiment of the present invention. The example device of FIG. 6A comprises a first chip 601 and a second chip 602. The first chip 601 includes back-to-back MOSFETs 610 and 612 and an ESD protection device 620. The ESD protection device 620 comprises a TVS with a diode 620' and first and second lateral PNP transistors 611, 613 having their bases connected to a common drain of the MOSFETs 610, 612, their collectors grounded and their emitters respectively connected to the sources of the first and second MOSFETs. The ESD protection device 620 shares a common drain with the MOSFETs 610 and 612. The second chip 602 includes an IC 690, for example, a USB load switch IC, such as a driver IC. The MOSFETs 610 and 612 have gates controlled by the IC 690. The example device 600 is designed to short to ground at a designated voltage between 7 V to 30 V, and accordingly is able to achieve an IEC protection rating of IEC6100-4-5 or IEC6100-4-2, which is system level ESD.

Figure 6B:
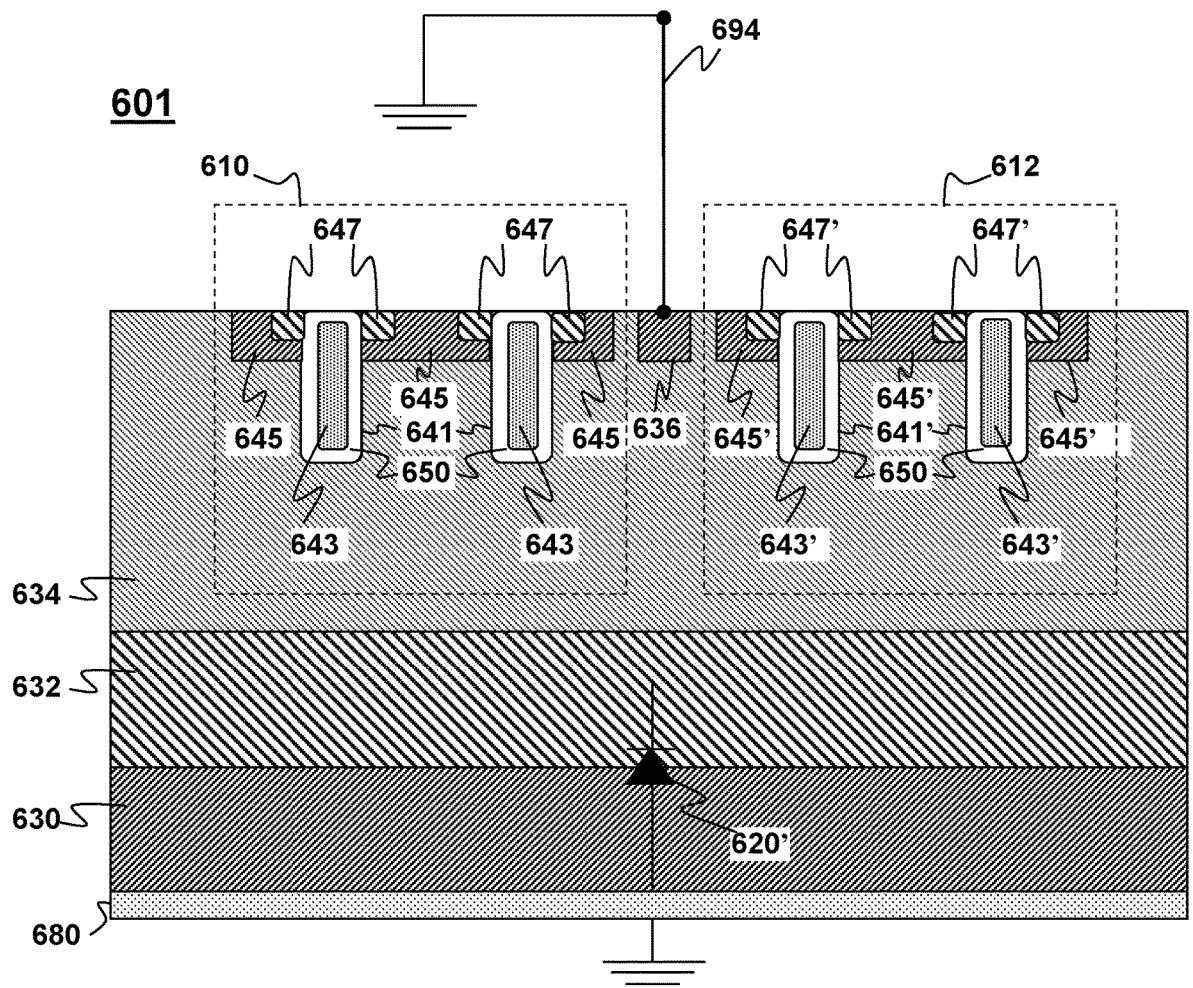
FIG. 6B is a cross-sectional view of the first chip of the load switch device in FIG. 6A.

FIG. 6B is a cross-sectional view of the first chip 601 of the example two-chip load switch device in FIG. 6A. Example chip 601 includes a P doped semiconductor layer 630 on which are formed a heavily doped N+ semiconductor layer 632 and a less heavily N− doped epitaxial layer 634. P body regions 645, 645' are formed within a top layer of the epitaxial layer 634. Gate trenches 641, 641' containing gate electrodes 643, 643' isolated by an insulator 650, e.g., an oxide, are formed within the epitaxial layer 634 and P body regions 645, 645'. Source regions 647, 647' are formed within the body regions 645, 654'. The body regions 645, 645', gate trenches 641, 641' with gate electrodes 643, 643', and source regions 647, 647' form the first and second MOSFETs 610, 612, which may be configured in a back-to-back arrangement through a common drain provided by the heavily doped N+ semiconductor layer 632. An additional P region 636 is formed in the epitaxial layer 634. The additional P region 636 acts as a collector for lateral PNP transistors 611, 613. An electrical contact 694, e.g., a metallic pad, provides a conductive path to connect the collector 636 to ground.

The ESD protection device 620 includes the lateral PNP transistors 611, 613 formed by body regions 645, 645' of the MOSFETs 610, 612 acting as the emitters, nearby portions of additional P region 636 acting as the collector, and portions of the epitaxial layer 634 between the body regions and collector acting as a common base for the lateral PNP transistors 611, 613. Similar to the embodiment of FIG. 4B, the chip 601 may make contact to a metal plate 680 at a bottom of the substrate 630 to provide ground connection to the cathode of the TVS diode 620'. Alternatively, an external diode in stacked form similar to the diode 420 of FIG. 4C having a metal layer between the heavily doped N+ semiconductor layer 630 and the cathode of diode 620'.

Figure 7A:
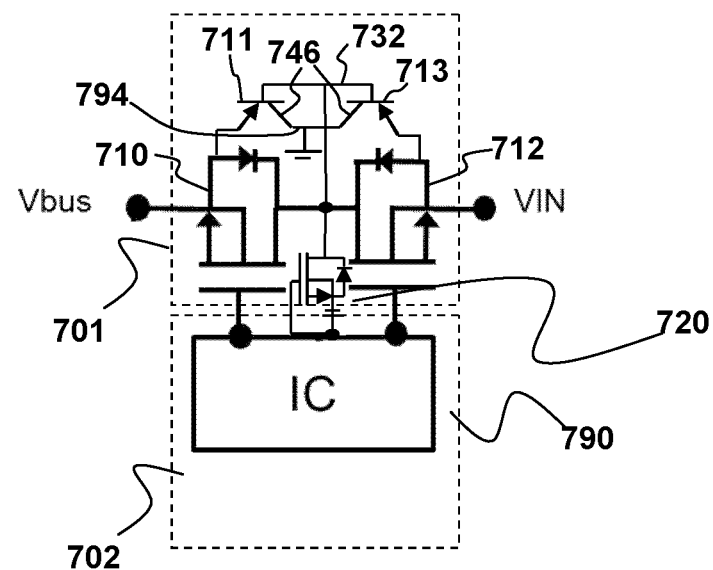
FIG. 7A is a circuit diagram of a two-chip load switch device with integrated ESD protection in accordance with an alternative embodiment of the present invention.

FIG. 7A is a circuit diagram of a two-chip load switch device 700 with integrated ESD protection in accordance with an alternative aspect of the present disclosure. The example device of FIG. 7A comprises a first chip 701 and a second chip 702. The first chip 701 includes back-to-back MOSFETs 710 and 712 and an ESD protection device 720. The ESD protection device 720 comprises an additional MOSFET structure 714 with its source, body, and gate tied to ground in a manner similar to the MOSFET 514 of FIGS. 5A-5C. The MOSFET 714 functions in cooperation with lateral PNP transistors 711, 713 configured in a manner similar to that shown in FIGS. 6A-6C. The ESD protection device 720 shares this drain with the MOSFETs 710 and 712. The second chip 702 includes an IC 790, for example, a MOSFET driver IC. The MOSFETs 710 and 712 have gates controlled by the IC 790. The example device 700 is designed to short to ground at a designated voltage between 7 V to 30 V, and accordingly is able to achieve an IEC protection rating of IEC6100-4-5.

Figure 7B:
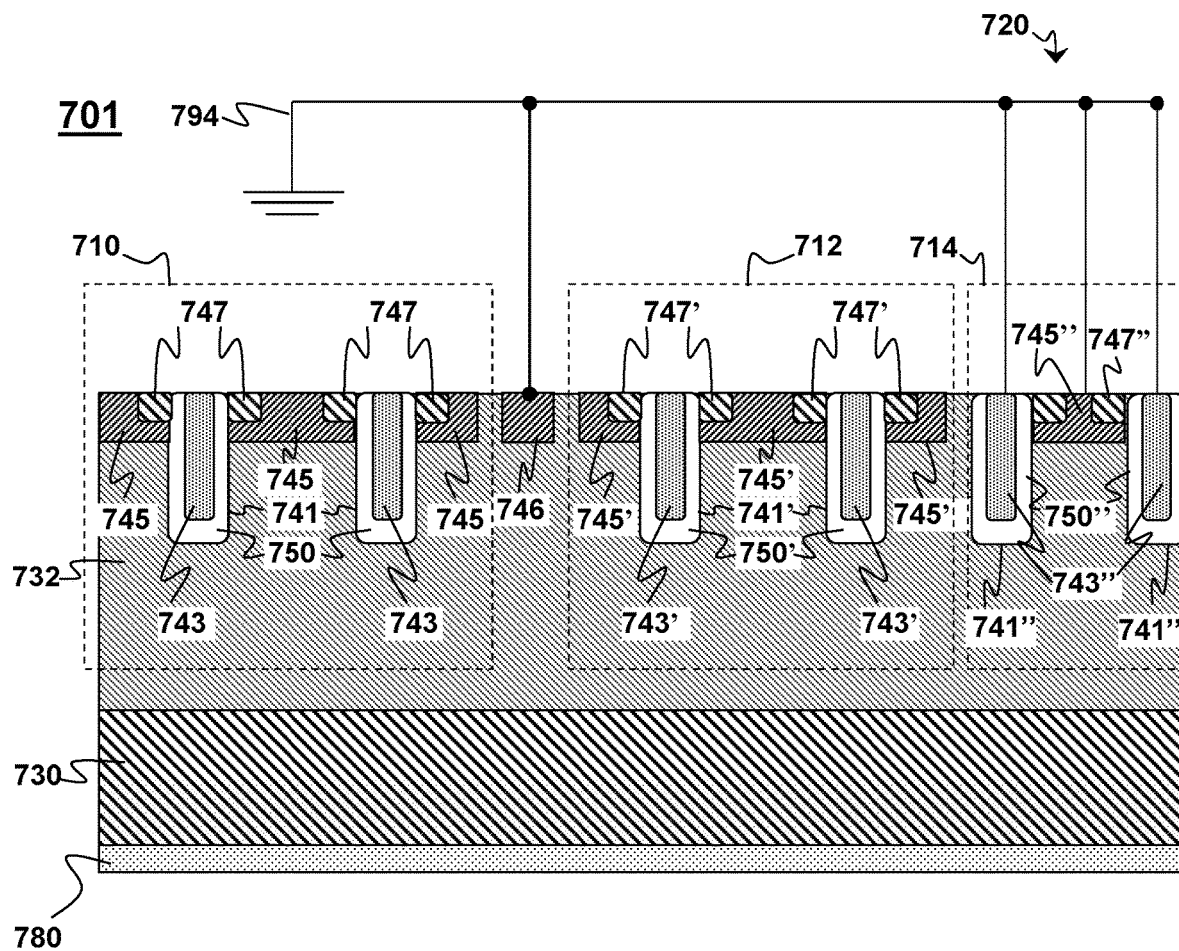
FIG. 7B is a cross-sectional view of the first chip of the load switch device in FIG. 7A.

FIG. 7B is a cross-sectional view of the first chip 701 of the example two-chip load switch device in FIG. 7A. Example chip 701 is formed on a heavily doped N+ semiconductor substrate 730 which supports a less heavily N− doped epitaxial layer 732. P body regions 745, 745', and 745" for the MOSFETS 710, 712, and 714 are formed within a top layer of the epitaxial layer 732. Gate trenches 741, 741', 741" containing insulated gate electrodes 743, 743', 743" isolated by an insulator 750, 750', 750" e.g., an oxide, are formed within the epitaxial layer 732 and P body regions 745, 745', and 745". N+ source regions 747, 747', and 747" are formed within body regions 745, 745', and 745", respectively, as illustrated. Body region 745, isolation gate trenches 741 with gates 743, and source regions 747 collectively form a first MOSFET 710. Body region 745', gate trenches 741' with gates 743', and source regions 747' collectively form a second MOSFET 712. The first and second MOSFETs are configured in a back-to-back arrangement via the common drain provided by the semiconductor substrate 730.

The third MOSFET 714 includes a P body region 745", gate trenches 741" containing insulated gates 743" formed within the epitaxial layer 732 and P body region 745" and source regions 747" formed within body region 745". The third MOSFET may be configured to operate as a diode, e.g., by permanently connecting its gate electrodes 743" to source potential.

Figure 7C:
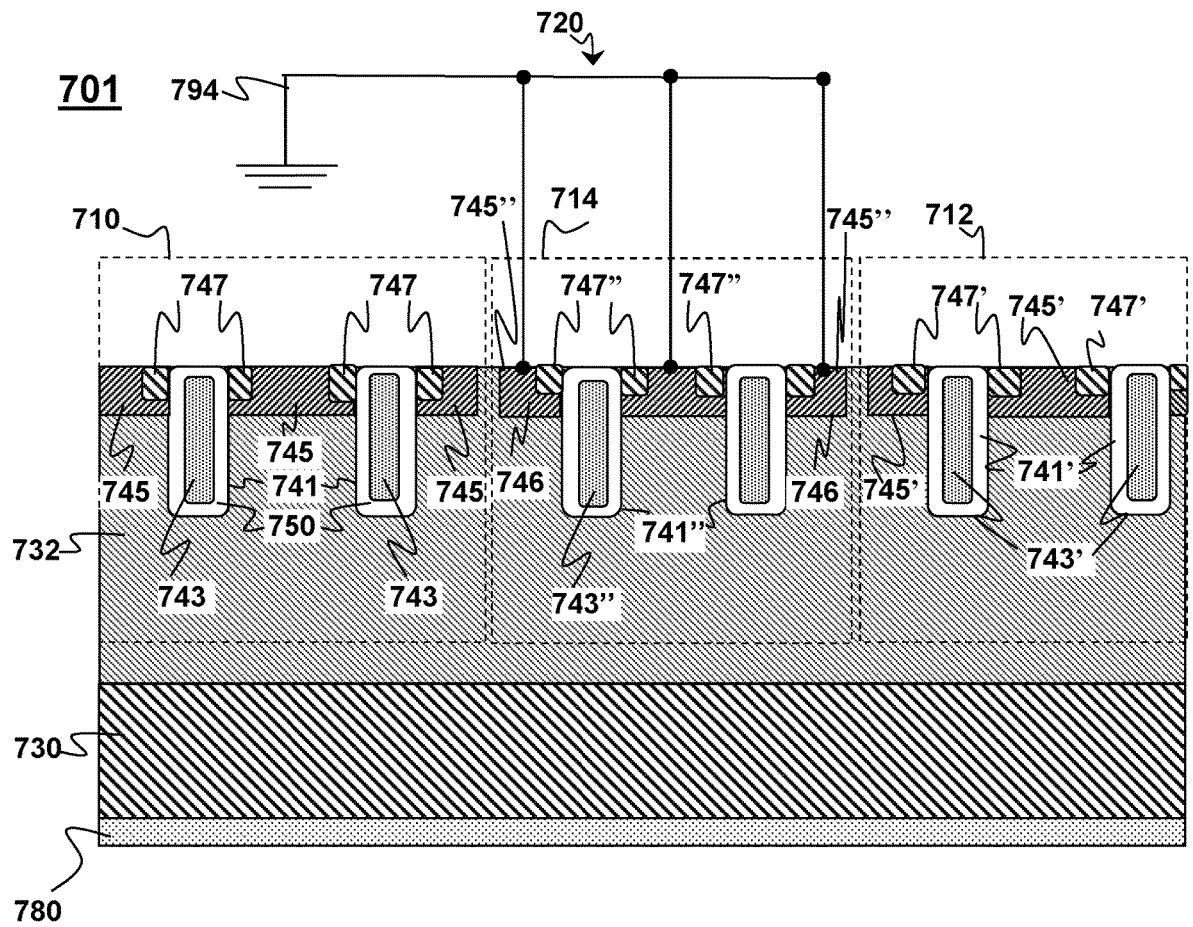
FIG. 7C is a cross-sectional view of an alternative implementation of the first chip of the load switch device in FIG. 7A

Additional P region 746 is laid out such that a portion of this region lies between the first and second MOSFETS 710, 712 and acts as a collector for lateral PNP transistors 711, 713. As in the implementation shown in FIGS. 6A-6C, the body regions 745, 745' of the MOSFETs 710, 712 act as the emitters for the lateral PNP transistors 711, 713 and nearby portions of additional P region 746 that acts as the collector. Portions of the epitaxial layer 732 between the body regions 745, 745' and the collector 746 act as a common base for the lateral PNP transistors 711, 713. An electrical contact 794, e.g., a metallic pad, provides a conductive path to connect the collector 746 to ground. As an option, the additional P region 746 may be formed as an extension of the P body region 745" between the first and second MOSFETS 710, 712. As shown in FIG. 7C, the third MOSFET 714 includes a P body region 745" disposed between the first and second MOSFETS 710, 712. Portions of the P body region 745" outside the gate trenches respectively act as collectors for lateral PNP transistors 711, 713. As with the device of FIGS. 6A-6C, the first and second MOSFET structures share a common drain provided by the epitaxial layer 732 and substrate 730.

Chip 701 may include a drain contact in the form of a metal layer 780 on a back side of substrate 730. The metal layer may be comprised of various metals, including by way of example and not by way of limitation, copper.

Figure 8A:
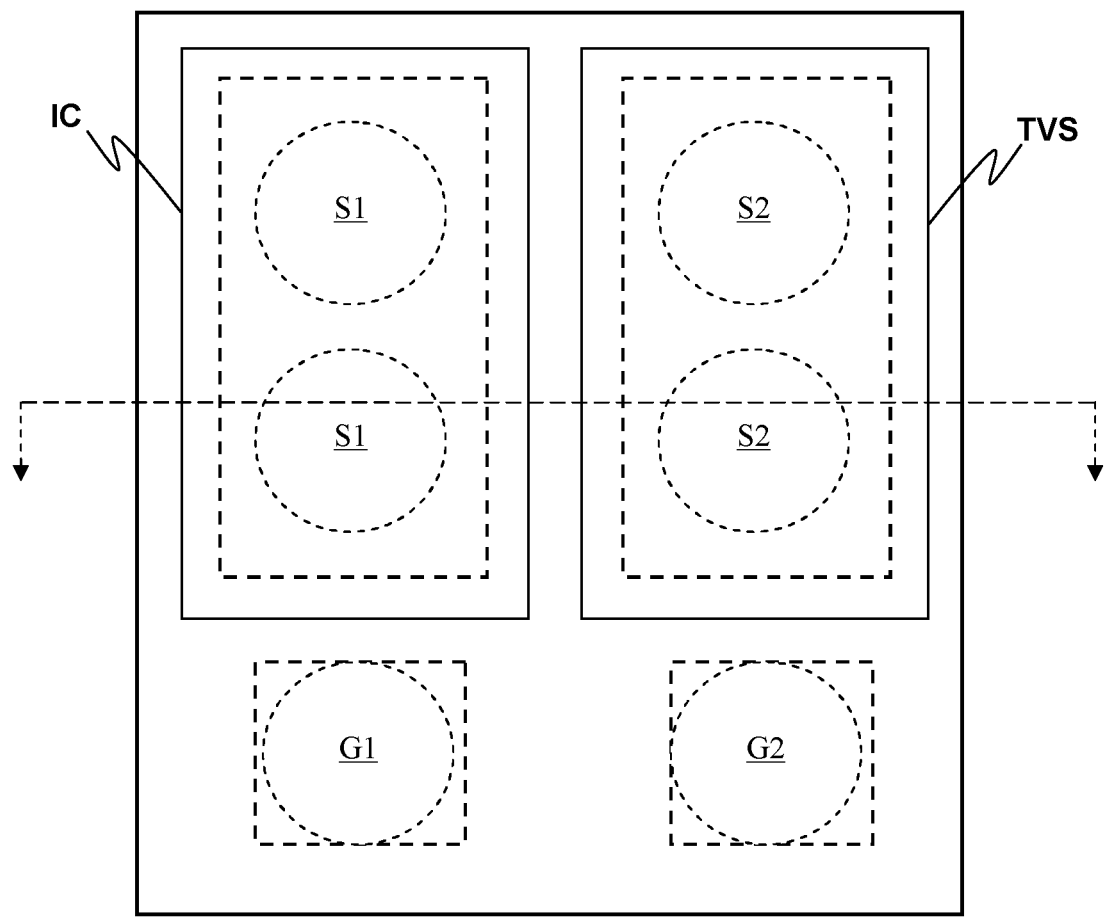
FIG. 8A is a top-down view of a "flipped chip" load switch device with integrated ESD protection in accordance with an alternative embodiment of the present invention.
Figure 8B:
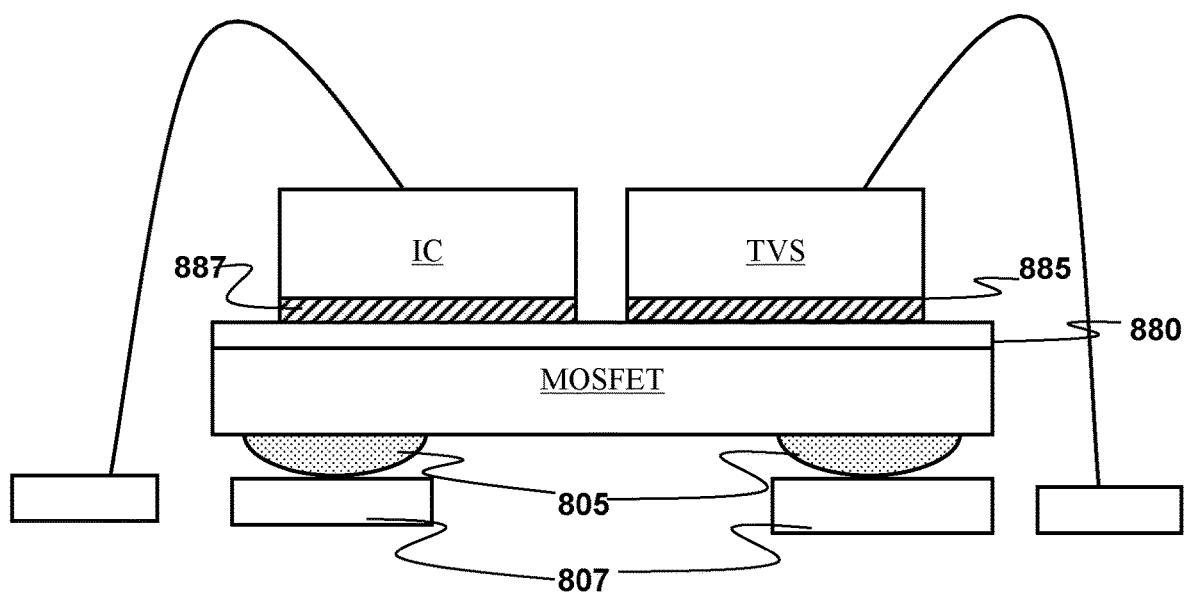
FIG. 8B is a cross-sectional view of the flipped chip embodiment of FIG. 8A.

The load switch devices as described above are provided with common drain MOSFETs integrated with ESD on a single chip. An alternative embodiment may co-package common drain MOSFETs and a discrete TVS together with a controller IC chip to achieve the same functionality. FIG. 8A is a top-down view of a "flipped chip" load switch device with ESD protection. In this implementation the chip containing the back to back MOSFETS has contact balls on a flip bottom side disposed on source pads S1, S2, and gate pads G1, G2 of the first and second MOSFETS. Connection for the TVS is made from the top side. FIG. 8B is a cross-sectional view of the flipped chip embodiment of FIG. 8A showing solder balls 805 disposed on the gate pads G1, G2 and source pads connected to respective leads 807 of a lead frame, the controller IC chip IC and the TVS chip are both disposed on a flip top surface of the MOSFET chip, where a back metal layer 880 is formed. A cathode electrode on a bottom of the TVS chip electrically connects to the back metal layer 880 through conductive adhesive layer 885 and the controller IC chip has a bottom surface attached to the back metal layer 880 through a nonconductive adhesive layer 887. Wire connections may be established to connect the electrodes on the top surfaces of the controller IC chip and the TVS chip to other leads of the lead frame as necessary.

Figure 9A:
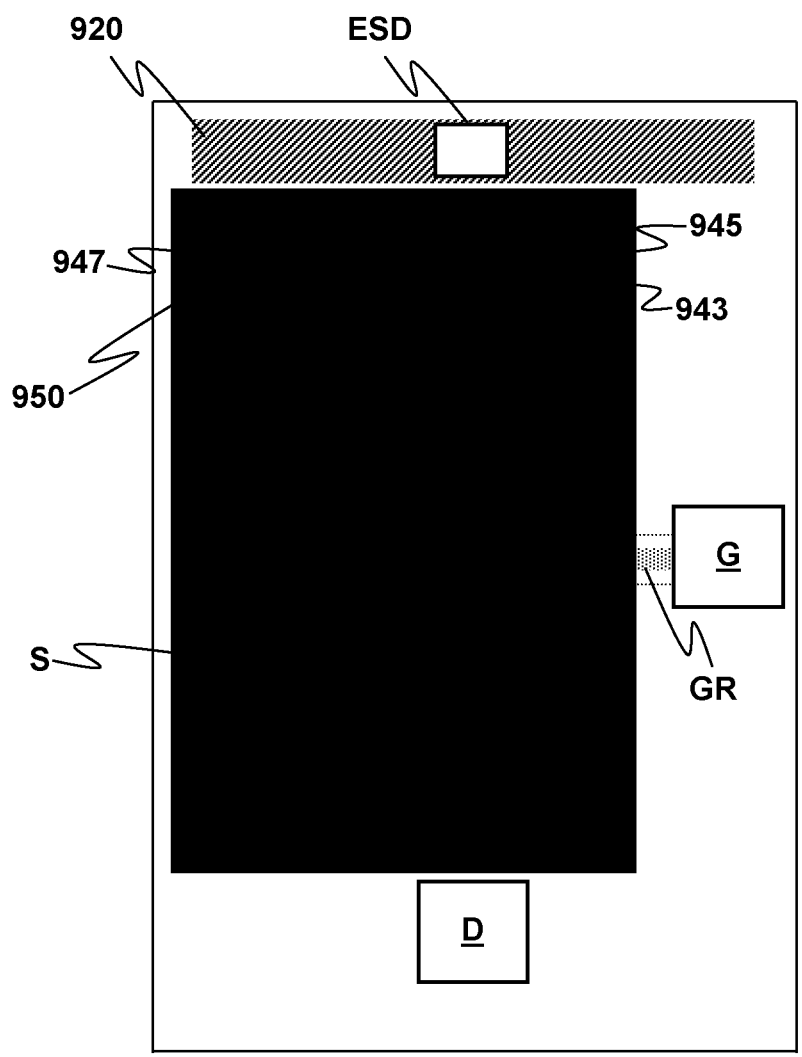
FIG. 9A illustrates a top-down view of an example load switch device of a single MOSFET in an unpackaged state in accordance with an embodiment of the present invention
Figure 9B:
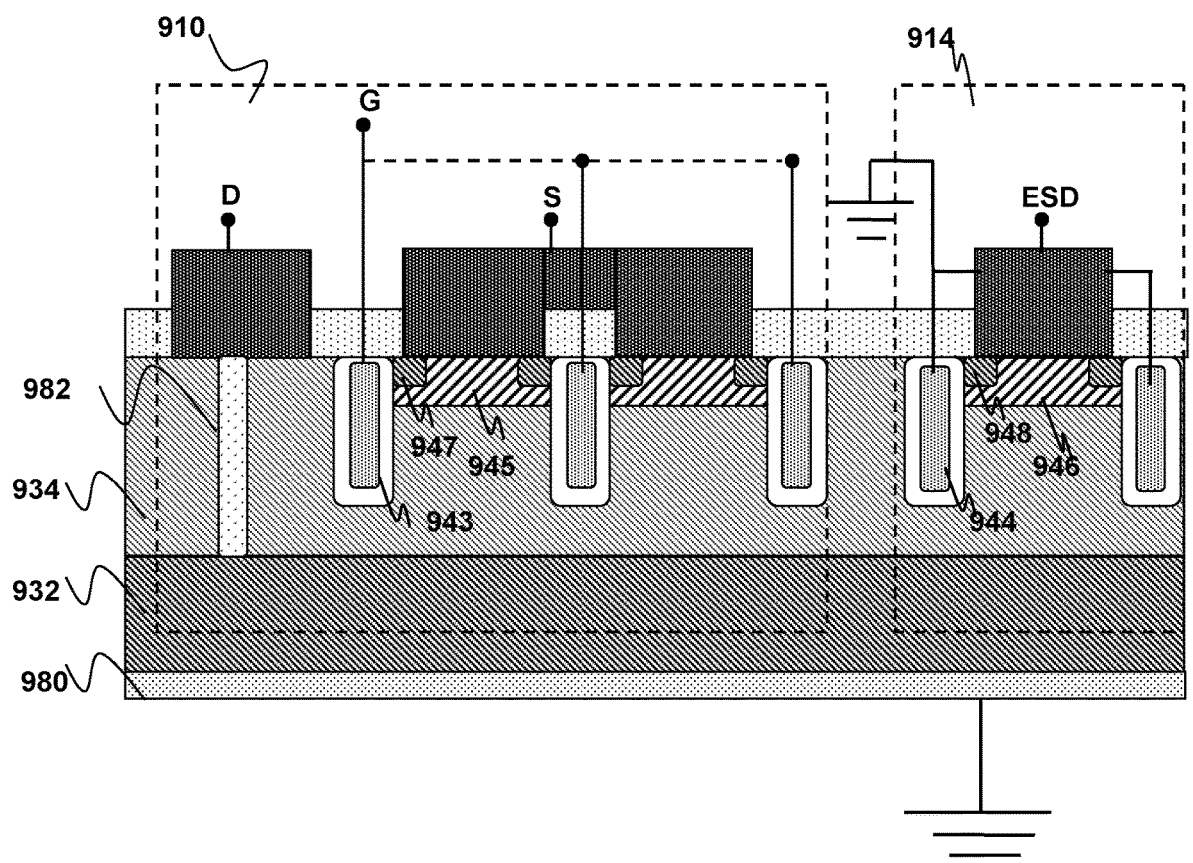
FIG. 9B illustrates a top-down view of an example load switch device in an unpackaged state in accordance with an embodiment of the present invention.

FIG. 9A illustrates a top-down view of an example four terminal device illustrated in FIG. 2 in an unpackaged state in accordance with an aspect of the present disclosure. FIG. 9B is a cross-sectional view of a chip 901. Unlike chip 501 of FIG. 5B, the example chip 901 includes only one MOSFET 910 integrated with an ESD protection device 920 comprises a MOSFET structure 914 that functions as a TVS diode through connection of its source and gate to ground. The example chip 901 may be formed on a heavily N+ doped semiconductor substrate layer 932 and a lightly N− doped epitaxial layer 934. As in FIG. 5B, P body regions 945 and 946 for MOSFETs 910 and 914 are formed within an upper portion of the epitaxial layer 934. MOSFETs 910 and 914 respectively further include insulated gate electrodes 943 and 944 formed within the epitaxial layer 934, N+ source regions 947 and 948 formed within body regions 945 and 946, as illustrated. The N+ doped substrate layer 932 is electrically connected to a bottom metal layer 980 serving as a drain electrode for MOSFETs 910, 914.

Source contact pads S make vertical contact to the body regions 945 and source regions 947. A gate contact pad G makes vertical connection to a gate runner GR that is connected to the gate electrodes 943. An optional drain contact pad D is provided on top surface through a metal connection 982 to the substrate layer 932 of the device. An ESD pad is provided on top surface of the chip as shown.

Aspects of the present disclosure include implementations in which one or more MOSFETs and a TVS integrated into a single chip are used in "half-bridge" or "full-bridge" circuits. As is well-known in the art, a full bridge is an electronic circuit that enables a voltage to be applied across a load in either direction. Full-bridge circuits are often used, e.g., in robotics and other applications to allow DC motors to run forwards and backwards. Most DC-to-AC converters (power inverters), most AC/AC converters, the DC-to-DC push-pull converter, most motor controllers, and many other kinds of power electronics use half-bridges. Full bridge circuits are typically made from two half-bridges.

Figure 10:
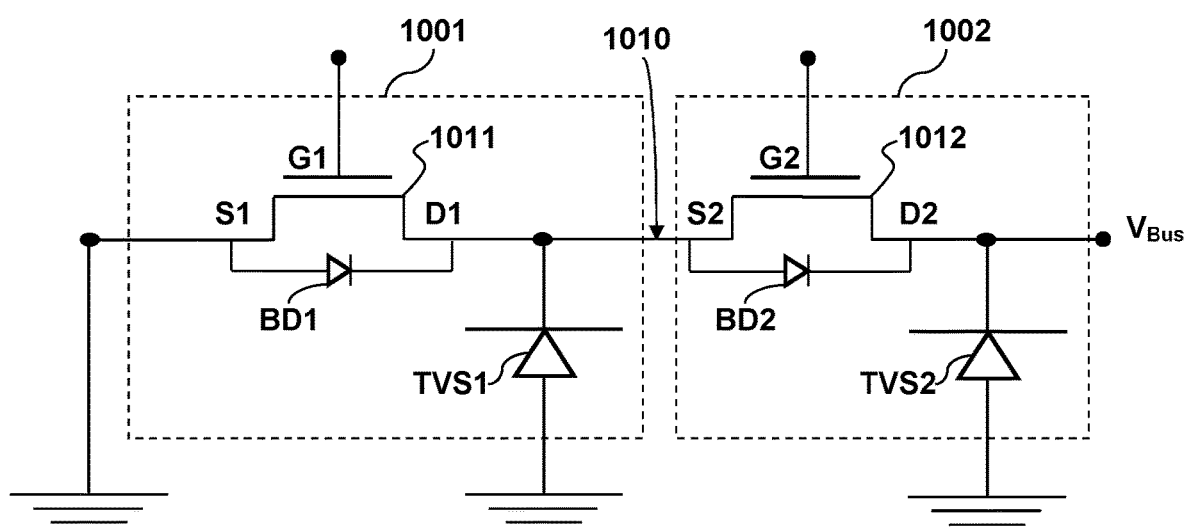
FIG. 10 is a circuit diagram of a "half-bridge" load switch device with integrated ESD protection in accordance with an alternative embodiment of the present invention.

FIG. 10 is a circuit diagram of a "half-bridge" utilizing two of the four terminal devices illustrated in FIGS. 9A and 9B interconnected in series in accordance with aspects of the present disclosure. First and second four terminal devices 1001, 1002 respectively include first and second MOSFETs 1011, 1012 and first and second integrated transient voltage suppressors TVS1, TVS2. The MOSFETs 1011, 1012 respectively include sources S1, S2, gates G1, G2, and drains D1, D2. In some implementations, the MOSFETs may include body diodes BD1, BD2. The transient voltage suppressors TVS1, TVS2 are configured to prevent current from flowing from the drains D1, D2 to ground. Although FIG. 10 represents the transient voltage suppressors TVS1, TVS2 as diodes, those skilled in the art will appreciate that an equivalent TVS function may be implemented using MOSFETs, as described hereinabove. The source S1 of the first MOSFET 1011 is coupled to ground. The drain D1 of the first MOSFET and the source S2 of the second MOSFET 1012 are coupled to a phase note 1010 as an output port of the half-bridge. The drain D2 of the second MOSFET 1012 is coupled to an input voltage $V_{Bus}$.

Figure 11:
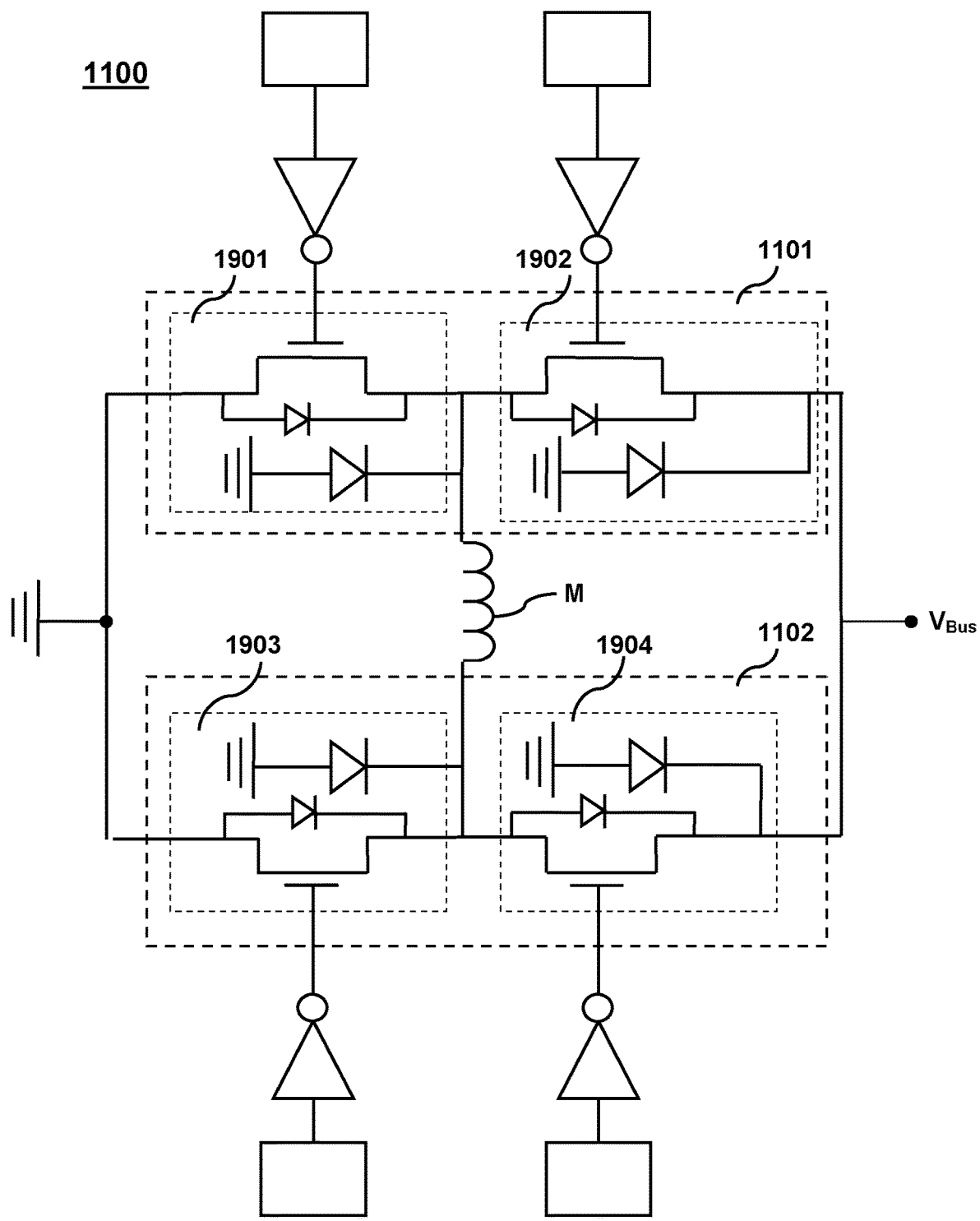
FIG. 11 is a circuit diagram of a "full-bridge" load switch device with integrated ESD protection in accordance with an alternative embodiment of the present invention.

FIG. 11 is a circuit diagram of an electric motor M driven by a "full-bridge" 1100 made of two half-bridge load switch devices 1101, 1102 with integrated ESD protection of the type depicted in FIG. 10. The motor M is an inductive load bridging between the phase notes of the two half-bridges that serve as the output ports. The "full-bridge" 1100 may utilize four of the four terminal devices illustrated in FIGS. 9A and 9B with first and second four terminals devices 1901, 1902 connecting in series forming the first half-bridge and third and fourth four terminal devices 1903 and 1904 connecting in series forming the second half-bridge. The sources of the first and third four terminals devices 1901, 1903 are coupled to ground. The drains of the second and fourth four terminals devices 1902, 1904 are coupled to an input voltage $V_{Bus}$. Alternatively, the second and fourth four terminals devices 1902, 1904 may be replaced by common drain MOSFETs as discussed in this disclosure, with the sources of the first and second MOSFETs respectively coupled to the drains of the first and third four terminals devices 1901, 1903 serving as the output ports for the inductive motor M and the common drain coupled to an input voltage $V_{Bus}$. The sources of the first and third four terminal devices 1901, 1903 are coupled to ground.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶ 6.

What is claimed is:

1. A device, comprising:
   first and second MOSFETs formed on a common chip and an electrostatic discharge (ESD) protection device formed on an ESD chip,
   wherein each MOSFET of the first and second MOSFETs has a source, a gate, and a common drain,
   wherein the ESD protection device is configured to implement a diode function that is configured to prevent current from flowing through the common chip from the common drain to a ground potential; and
   a controller integrated circuit (IC) coupled to the one or more MOSFETs, wherein the controller IC is formed on an IC chip that is separate from the common chip, wherein the controller IC chip and an ESD chip containing the ESD protection device are both disposed on a flip top surface of the common chip on which a back metal layer is formed, wherein a cathode electrode on a bottom of the ESD chip electrically connects to the back metal layer through a conductive adhesive layer and the IC chip has a bottom surface attached to the back metal layer through a nonconductive adhesive layer.

2. The device of claim 1, wherein the common chip includes:
a layer of semiconductor material of a first conductivity type;
wherein each MOSFET of the one or more MOSFETs includes a body region of a semiconductor material of a second conductivity type formed within an upper portion of the layer of semiconductor material of a first conductivity type;
a set of one or more trenches formed within the layer of semiconductor material of a first conductivity type, each trench in the set containing a gate electrode electrically insulated by a gate insulating material along sidewalls and bottoms of the trench, the set of trenches including at least a first trench and a second trench, wherein the body region is between the first and second trenches, and one or more source regions of semiconductor material of a first conductivity type formed within the body region.

3. The device of claim 2, wherein the one or more MOSFETs include first and second MOSFETs connected in a back-to-back configuration.

4. The device of claim 3, wherein the ESD protection device includes a MOSFET structure configured to act as a diode.

5. The device of claim 4, further comprising first and second lateral PNP structures, each having an emitter, a base and a collector, wherein the emitters of the first and second lateral PNP structures are respectively connected to the sources of the first and second MOSFETs and wherein the bases of the first and second lateral PNP structures are connected to each other and to the ESD protection structure and wherein the collectors of the first and second lateral PNP structures are connected to ground.

6. The device of claim 2, wherein the first conductivity type is N and the second conductivity type is P.

7. The device of claim 2, wherein the substrate is a heavily doped N-type semiconductor substrate.

8. The device of claim 7, wherein the semiconductor material of the first epitaxial layer is an N-type material having a lower N-type doping concentration than the substrate.

9. The device of claim 2, wherein each of the first and second trenches is filled with dielectric material.

10. The device of claim 2, wherein each gate electrode is made of polysilicon.

11. The device of claim 2, wherein each trench is lined with dielectric material and a remaining portion of each trench is filled with a conductive material that forms the gate electrodes.

12. The device of claim 2, further comprising a controller integrated circuit (IC) coupled to the one or more MOSFETs.

13. The device of claim 1, further comprising one or more wire connections that connect the electrodes on the top surfaces of the IC chip and the ESD chip.

* * * * *